US012672536B2

(12) United States Patent
Kang et al.

(10) Patent No.: US 12,672,536 B2
(45) Date of Patent: Jun. 30, 2026

(54) SEMICONDUCTOR DEVICE WITH POWER TAP CELLS, POWER RAILS, AND POWER DELIVERY NETWORK CONNECTED BY THROUGH VIAS

(71) Applicant: Samsung Electronics Co., Ltd., Suwon-si (KR)

(72) Inventors: Byung Ju Kang, Suwon-si (KR); Pan Jae Park, Suwon-si (KR); Ji Wook Kwon, Suwon-si (KR); Chul Hong Park, Suwon-si (KR); Jae Seok Yang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 501 days.

(21) Appl. No.: 18/304,560

(22) Filed: Apr. 21, 2023

(65) Prior Publication Data

US 2023/0361037 A1     Nov. 9, 2023

(30) Foreign Application Priority Data

May 3, 2022    (KR) ........................ 10-2022-0054969

(51) Int. Cl.
H10W 20/41      (2026.01)
G06F 30/31      (2020.01)
(Continued)

(52) U.S. Cl.
CPC .......... H10W 20/427 (2026.01); G06F 30/31 (2020.01); H10D 30/43 (2025.01);
(Continued)

(58) Field of Classification Search
CPC ............... H01L 23/5286; H01L 23/481; H01L 23/49827; H01L 23/49838; H01L 23/50;
(Continued)

(56) References Cited

U.S. PATENT DOCUMENTS 10,998,413 B2    5/2021  Hiblot et al.
11,158,580 B2    10/2021  Sio et al.
(Continued)

FOREIGN PATENT DOCUMENTS

EP           3940761 A1    1/2022
KR    10-2022-0050267 A    4/2022
WO        2015138754 A1    9/2015

OTHER PUBLICATIONS

European Search Report for EP Application No. 23170410.7 dated Oct. 12, 2023, 4 pages.

(Continued)

*Primary Examiner* — Herve-Louis Y Assouman
(74) *Attorney, Agent, or Firm* — Wolf, Greenfield & Sacks, P.C.

(57) ABSTRACT

A semiconductor device is provided. The semiconductor device includes a substrate including a first side and a second side that are opposite to each other, a power tap cell in a first row, a second row adjacent to the first row, and a third row adjacent to the second row, on the first side of the substrate, a first power rail and a second power rail on the power tap cell, that extend in a first direction and are spaced apart from each other in a second direction, and a power delivery network on the second side of the substrate. The power tap cell includes a first power through via that penetrates the substrate and extends from the power delivery network to the first power rail, and a second power through via that penetrates the substrate and extends from the power delivery network to the second power rail.

18 Claims, 17 Drawing Sheets

(51) Int. Cl.

| | |
|---|---|
| *H10D 30/43* | (2025.01) |
| *H10D 30/67* | (2025.01) |
| *H10D 62/10* | (2025.01) |
| *H10D 84/83* | (2025.01) |
| *H10D 84/85* | (2025.01) |
| *H10D 89/10* | (2025.01) |
| *H10W 20/20* | (2026.01) |
| *H10W 20/40* | (2026.01) |
| *H10W 20/42* | (2026.01) |
| *H10W 70/63* | (2026.01) |
| *H10W 70/65* | (2026.01) |
| *H10W 72/00* | (2026.01) |

(52) U.S. Cl.
CPC ....... *H10D 30/6735* (2025.01); *H10D 62/121* (2025.01); *H10D 84/85* (2025.01); *H10W 20/20* (2026.01)

(58) Field of Classification Search
CPC . H01L 23/5226; H01L 23/5283; G06F 30/31; H10D 30/43; H10D 30/6735; H10D 62/121; H10D 84/85; H10D 84/83; H10D 89/10

See application file for complete search history.

(56) References Cited

U.S. PATENT DOCUMENTS

| | | | |
|---|---|---|---|
| 2018/0145030 A1* | 5/2018 | Beyne | H01L 21/76898 |
| 2019/0286784 A1 | 9/2019 | Chang et al. | |
| 2020/0042668 A1* | 2/2020 | Peng | H10D 89/10 |
| 2021/0225830 A1 | 7/2021 | Liu | |
| 2021/0242130 A1 | 8/2021 | Peng et al. | |
| 2021/0375761 A1 | 12/2021 | Chang et al. | |
| 2022/0077062 A1 | 3/2022 | Van Dal et al. | |
| 2022/0122970 A1 | 4/2022 | Do et al. | |
| 2022/0181258 A1* | 6/2022 | Liebmann | H10D 30/67 |

OTHER PUBLICATIONS

Office Action for EP Application No. 23170410.7 dated Oct. 25, 2023, 6 pages.

* cited by examiner

SEMICONDUCTOR DEVICE WITH POWER TAP CELLS, POWER RAILS, AND POWER DELIVERY NETWORK CONNECTED BY THROUGH VIAS

CROSS-REFERENCE TO RELATED APPLICATION

This application claims priority from Korean Patent Application No. 10-2022-0054969, filed on May 3, 2022 in the Korean Intellectual Property Office, the disclosure of which is incorporated by reference herein in its entirety.

BACKGROUND

The present disclosure relates to a semiconductor device.

As the electronics industry develops to a high degree, the demand for desirable characteristics of semiconductor devices gradually increases. For example, there is an increasing demand for high reliability, high speed and/or multi-functionality for the semiconductor devices. In order to satisfy these required characteristics, structures inside the semiconductor device gradually become more complicated and highly integrated.

SUMMARY

One or more embodiments provide a semiconductor device having improved product reliability.

According to an aspect of an example embodiment, a semiconductor includes a substrate including a first side and a second side that are opposite to each other, a power tap cell in a first row, a second row adjacent to the first row, and a third row adjacent to the second row, on the first side of the substrate, a first power rail and a second power rail on the power tap cell, that extend in a first direction and are spaced apart from each other in a second direction, and a power delivery network on the second side of the substrate. The power tap cell includes a first power through via that penetrates the substrate and extends from the power delivery network to the first power rail, and a second power through via that penetrates the substrate and extends from the power delivery network to the second power rail.

According to an aspect of an example embodiment, a semiconductor includes a substrate including a first side and a second side that are opposite to each other, a first power rail and a second power rail on the first side of the substrate, that extend in a first direction and are spaced apart from each other in a second direction, a first dummy region and a second dummy region on the first side of the substrate, with an element separation film between the first power rail and the second power rail, a power delivery network on the second side of the substrate, a first power through via that penetrates the element separation film and the substrate, and connects the power delivery network and the first power rail, and a second power through via that penetrates the element separation film and the substrate, and connects the power delivery network and the second power rail. The first power rail includes a first extension part that extends in the first direction, and a first expansion part that has a first width greater than a second width of the first extension part in the second direction, the second power rail includes a second extension part that extends in the first direction, and a second expansion part that has a third width greater than the second width of the first extension part in the second direction. The first power through via is connected to the first expansion part, and the second power through via is connected to the second expansion part.

According to an aspect of an example embodiment, a semiconductor includes a substrate including a plurality of power tap cells and a plurality of logic cells, a first power rail and a second power rail that extend in a first direction and are arranged in a second direction, on a first side of the substrate, and a power delivery network on a second side opposite the first side of the substrate. Each of the plurality of power tap cells includes a first power through via that connects the first power rail and the power delivery network, and a second power through via that connects the second power rail and the power delivery network.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail example embodiments thereof referring to the attached drawings, in which.

DETAILED DESCRIPTION

Figure 1:
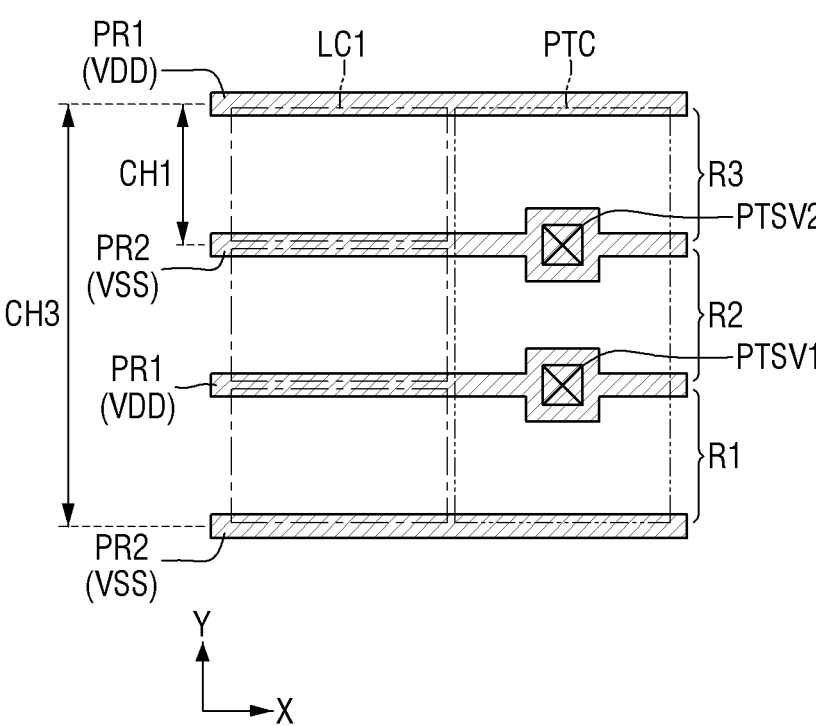
FIG. 1 is a schematic plan view of a semiconductor device according to some embodiments.

FIG. 1 is a schematic plan view of a semiconductor device according to some embodiments.

Referring to FIG. 1, the semiconductor device according to some embodiments may include a first logic cell LC1 and a power tap cell PTC.

The first logic cell LC1 may be placed to be arranged in a plurality of rows R1, R2, and R3. For example, each first logic cell LC1 may be placed in the first to third rows R1, R2, and R3 which extend in a first direction X and arranged in a second direction Y. A second row R2 may be adjacent to a first row R1, and a third row R3 may be adjacent to the second row R2. Here, the fact that two rows are adjacent means that no row is placed between the two rows. That is, no row is placed between the second row R2 and the first row R1 and between the third row R3 and the second row R2. The second direction Y may be perpendicular to the first direction X.

The first to third rows R1, R2, and R3 may have a first cell height CH1 defined in the second direction Y. The first logic cell LC1 is placed in any of the first to third rows R1, R2, and R3, and may have a first cell height CH1. That is, the first logic cell LC1 may be a single height cell.

A first power rail PR1 and a second power rail PR2 may extend in the first direction X and be spaced apart from each other in the second direction Y. The first power rail PR1 and the second power rail PR2 may be arranged alternately in the second direction Y. The first power rail PR1 and the second power rail PR2 may extend along the boundary between the first to third rows R1, R2, and R3. For example, the first power rail PR1 may extend along the boundary between the first row R1 and the second row R2, and the second power rail PR2 may extend along the boundary between the second row R2 and the second row R3. The first power rail PR1 may provide a first voltage VDD, and the second power rail PR2 may provide a second voltage VSS different from the first voltage VDD. For example, the first voltage VDD may be a positive (+) voltage, and the second voltage VSS may be a ground (GND) voltage or a negative (−) voltage.

The first logic cell LC1 may be defined between the first power rail PR1 and the second power rail PR2. The first cell height CH1 may be substantially equal to the distance between the first power rail PR1 and the second power rail PR2, based on measuring between the centers of the first power rail PR1 and the second power rail PR2. The first logic cell LC1 is configured to receive at least one of a first voltage from the first power rail PR1 or a second voltage from the second power rail PR2.

The first logic cell LC1 may include a first active region of a first conductive type and a second active region of a second conductive type arranged along the second direction Y. For example, the first active region may be a PMOSFET region, and the second active region may be an NMOSFET region. The first logic cell LC1 may include a gate electrode arranged along the first direction X and extending in the second direction Y. The gate electrodes may be arranged along the first direction X at a first pitch.

The first logic cell LC1 may mean any one of various cells for implementing a logic circuit. For example, the first logic cell LC1 may represent at least one of various logic elements such as an AND gate, a NAND gate, an OR gate, a NOR gate, an XOR gate, an inverter and the like. The first logic cell LC1 may include transistors for forming each logic element, and wirings for connecting the transistors to each other. The first logic cell LC1 may be referred to as a standard cell.

The power tap cells PTC may be continuously placed in the first to third rows R1, R2, and R3. The power tap cell PTC may have a third cell height CH3 that is three times the first cell height CH1. That is, the power tap cell PTC may be a triple height cell. The first power rail PR1 and the second power rail PR2 may extend in the first direction X on the power tap cell PTC.

The power tap cell PTC may include two power through vias PTSV1 and PTSV2. A first power through via PTS may connect the first power rail PR1 and a power delivery network to be described below, and a second power through via PTSV2 may connect the second power rail PR2 and the power delivery network. Therefore, the power tap cell PTC may provide a first voltage VDD from the power delivery network to the first power rail PR1, and may provide a second voltage VSS from the power delivery network to the second power rail PR2. At least a part of the first power through via PTS may overlap the second power through via PTSV2 in the second direction Y.

Unlike the first logic cell LC1, the power tap cell PTC does not include a logic element. The power tap cell PTC may be a kind of dummy cell that only provides the first and second power rails PR1 and PR2 with the first and second voltages VDD and VSS but does not perform a circuit function.

The placement of the first logic cell LC1 and the power tap cell PTC shown in FIG. 1 is merely an example, and the placement of the first logic cell LC1 and the power tap cell PTC may be changed in various ways.

Figure 2:
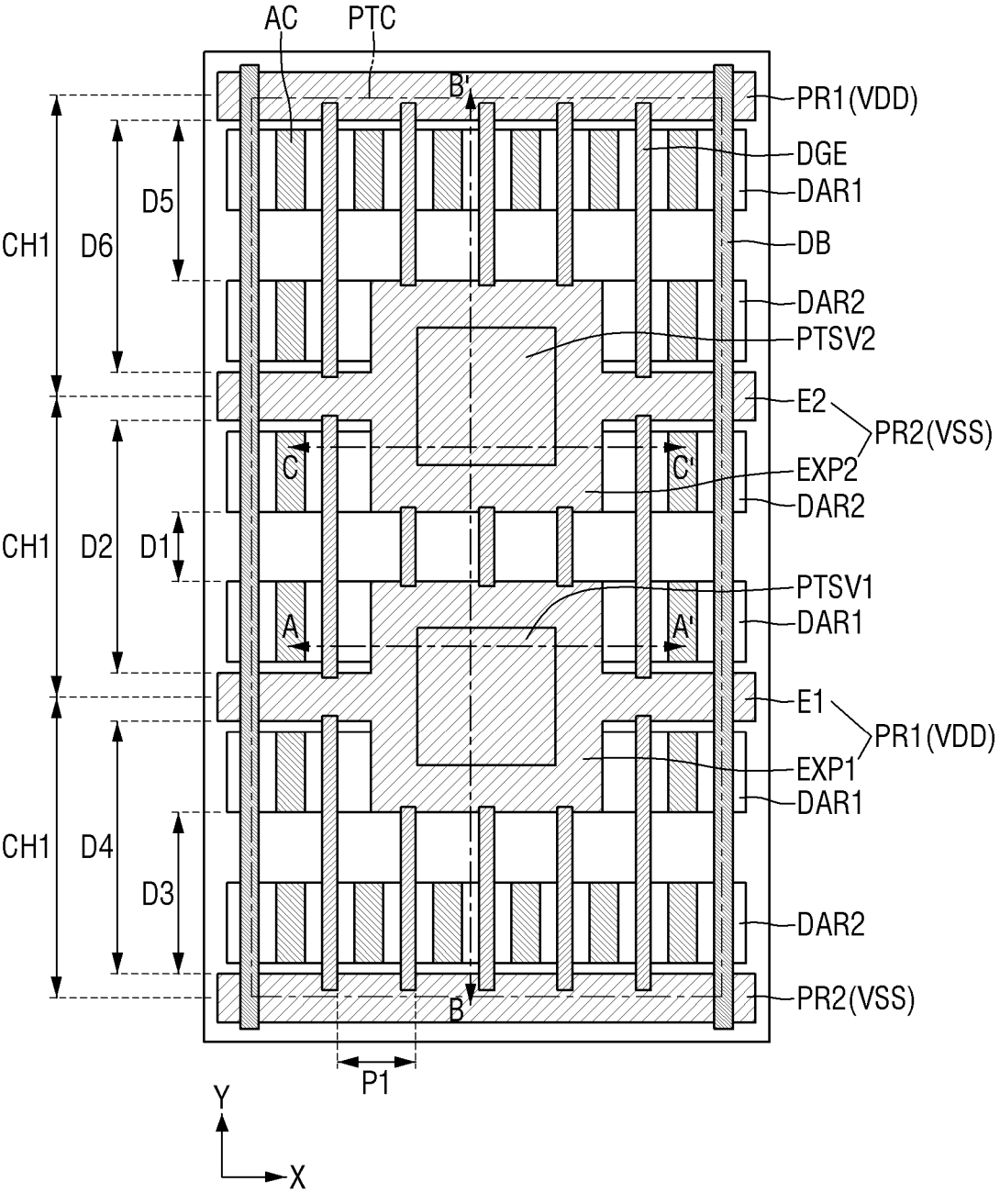
FIG. 2 is a schematic layout diagram of a power tap cell of FIG. 1.
Figure 3:
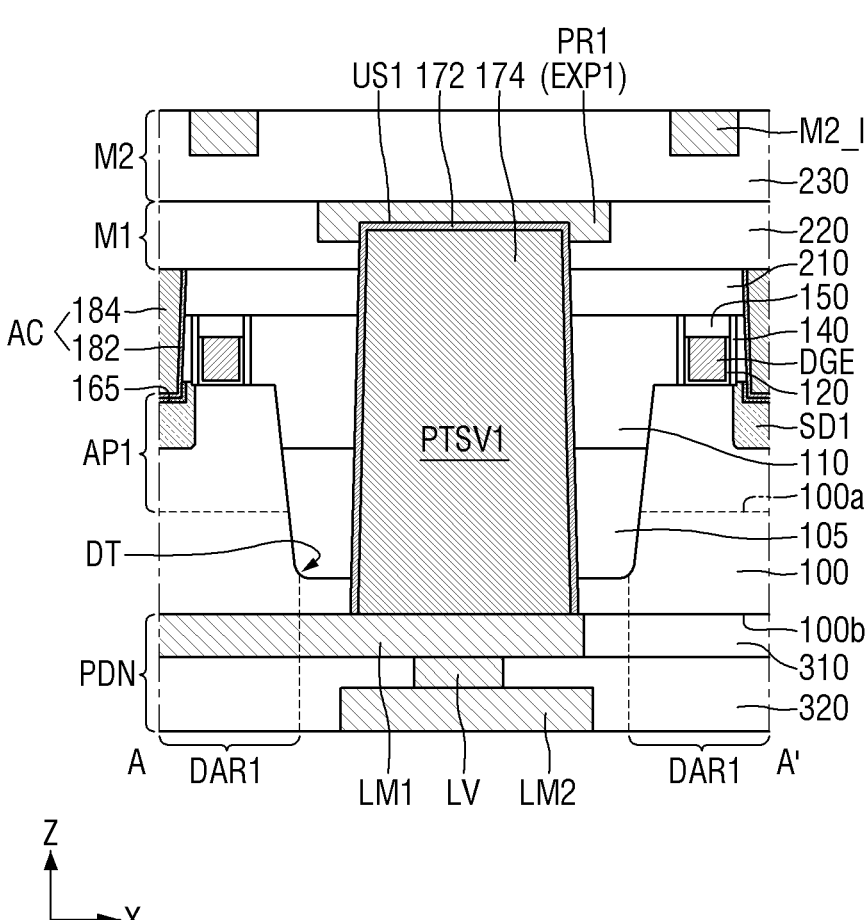
FIG. 3 is a cross-sectional view taken along a line A-A' of FIG. 2.
Figure 4:
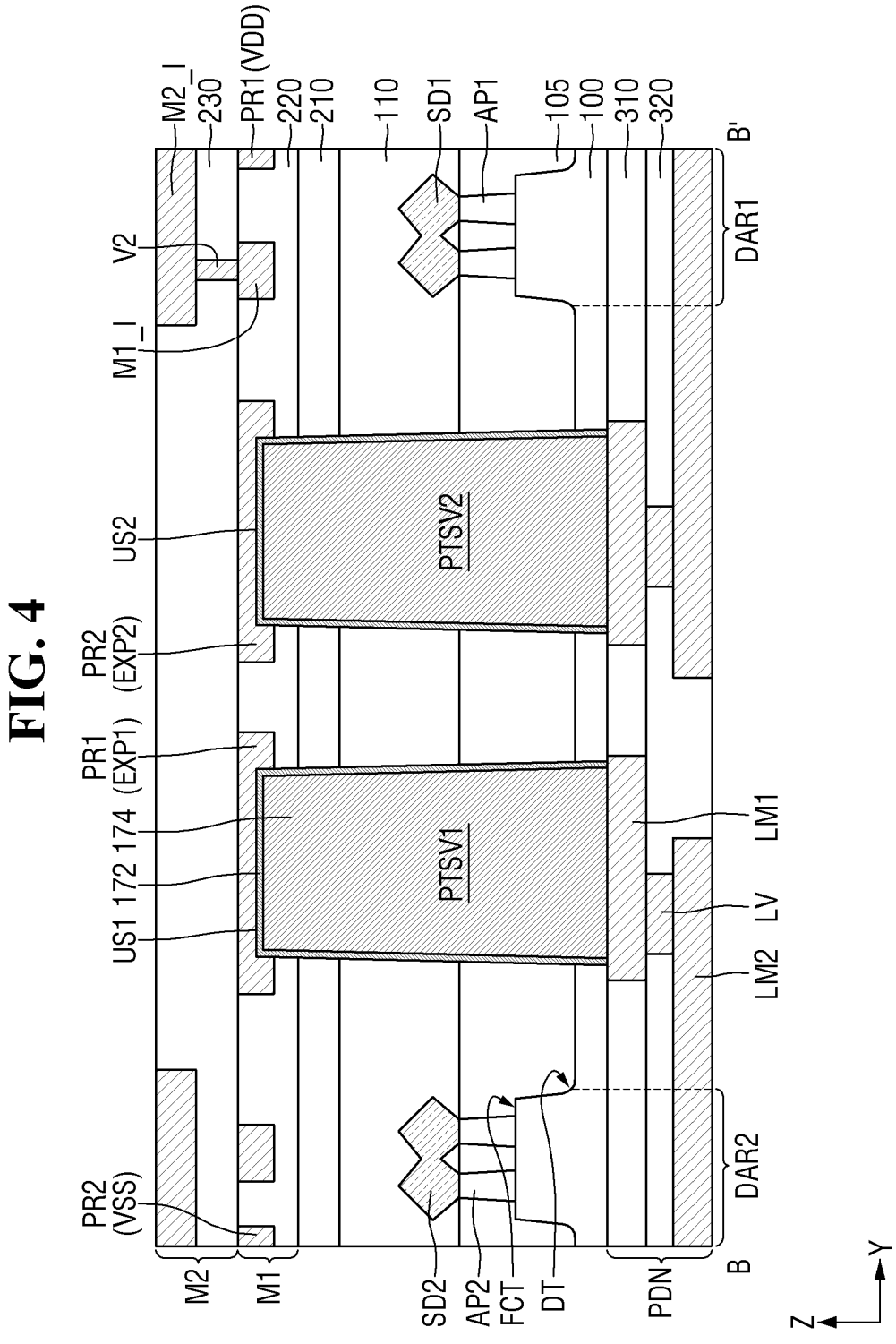
FIG. 4 is a cross-sectional view taken along a line B-B' of FIG. 2.

FIG. 2 is a schematic layout diagram of the power tap cell of FIG. 1. FIG. 3 is a cross-sectional view taken along a line A-A' of FIG. 2. FIG. 4 is a cross-sectional view taken along a line B-B' of FIG. 2.

Referring to FIGS. 2 to 4, the power tap cell PTC placed on the substrate 100 may include first and second dummy active regions DAR1 and DAR2, first and second active patterns AP1 and AP2, a dummy gate electrode DGE, a source/drain contact AC, a first metal layer M1, a second metal layer M2, and a power delivery network PDN.

The substrate 100 may be bulk silicon or silicon-on-insulator (SOI). In contrast, the substrate 100 may be a silicon substrate or may include, but not limited to, other materials, for example, silicon germanium, silicon germanium on insulator (SGOI), indium antimony, lead tellurium compounds, indium arsenic, indium phosphate, gallium arsenide, or gallium antimonide.

The substrate 100 may include a first side 100a and a second side 100b that are opposite to each other. The first side 100a may be called an upper side of the substrate 100, and the second side 100b may be called a lower side of the substrate 100. In some embodiments, the first logic cell (LC1 of FIG. 1) may be implemented on the first side 100a of the substrate 100.

The substrate 100 may include a first dummy active region DAR1 and a second dummy active region DAR2. For example, the first dummy active region DAR1 may be a PMOSFET region and the second dummy active region DAR2 may be an NMOSFET region. The first dummy active region DAR1 includes the same structure as that of the first active region of the first logic cell LC1 of FIG. 1, but does not form a circuit. The second dummy active region DAR2 includes the same structure as that of the second active region of the first logic cell LC1 of FIG. 1, but does not form a circuit.

The first dummy active region DAR1 and the second dummy active region DAR2 may be defined by the substrate trench DT. The substrate trench DT may extend in the first direction X to separate the first dummy active region DAR1 and the second dummy active region DAR2. The first dummy active region DAR1 and the second dummy active region DAR2 may extend in the first direction X. The first dummy active region DAR1 and the second dummy active region DAR2 may be spaced apart from each other in the second direction Y.

The first and second active patterns AP1 and AP2 may be formed on the substrate 100. For example, the first active pattern AP1 may be formed on the first dummy active region DAR1, and the second active pattern AP2 may be formed on the second dummy active region DAR2. The first and second active patterns AP1 and AP2 may extend in the first direction X. The first and second active patterns AP1 and AP2 may be spaced apart from each other in the second direction Y which intersects the first direction X.

The first and second active patterns AP1 and AP2 may be defined by a fin cut trench FCT. The fin cut trench FCT may define side walls of the first and second active patterns AP1 and AP2. The substrate trench DT may be a trench that is deeper than the fin cut trench FCT. In some embodiments, the first and second active patterns AP1 and AP2 may each include a fin type pattern that protrudes from the first side 100a of the substrate 100.

The first and second active patterns AP1 and AP2 may be a part of the substrate 100, or may include an epitaxial layer that grows from the substrate 100. The first and second active patterns AP1 and AP2 may include, for example, silicon or germanium, which are elemental semiconductor materials. Further, the first and second active patterns AP1 and AP2 may include a compound semiconductor, and may include, for example, a group IV-IV compound semiconductor or a group III-V compound semiconductor. The group W-W compound semiconductor may include, for example, a binary compound or a ternary compound including at least two or more of carbon (C), silicon (Si), germanium (Ge), and tin (Sn), or a compound obtained by doping these elements with a group IV element. The group III-V compound semiconductor may be, for example, at least one of a binary compound, a ternary compound or a quaternary compound formed by combining at least one of aluminum (Al), gallium (Ga) and indium (In) as a group III element with one of phosphorus (P), arsenic (As) and antimony (Sb) as a group V element. As an example, the first active pattern AP1 may include the same material as the second active pattern AP2. In another example, the first active pattern AP1 may include a different material from the second active pattern AP2.

The element separation film 105 may be formed on the first side 100a of the substrate 100. The element separation film 105 may surround at least a part of the side wall of the first active pattern AP1 and at least a part of the side wall of the second active pattern AP2. The element separation film 105 may fill at least a part of the substrate trench DT and the fin cut trench FCT. The first and second active patterns AP1 and AP2 may protrude above the upper surface of the element separation film 105, according to some embodiments.

The element separation film 105 may include, for example, an oxide film, a nitride film, an oxynitride film or a combination film thereof.

The dummy gate electrode DGE may be placed in the first and second dummy active regions DAR1 and DAR2. The dummy gate electrodes DGE may extend in the second direction Y, and may be spaced apart from each other in the first direction X. The dummy gate electrode DGE may be placed at a first pitch P1 along the first direction X. The dummy gate electrode DGE may intersect the first and second active patterns AP1 and AP2.

The first pitch P1 between the dummy gate electrodes DGE may be substantially the same as the pitch between the gate electrodes of the first logic cell LC1 of FIG. 1. The dummy gate electrode DGE includes the same structure as the gate electrodes placed on the first and second active regions of the first logic cell LC1 of FIG. 1, but does not form a circuit.

The dummy gate electrode DGE may include, for example, but not limited to, at least one of Ti, Ta, W, Al, Co, and combinations thereof. The dummy gate electrode DGE may include, for example, silicon, silicon germanium or the like other than metal.

Although the dummy gate electrode DGE is shown as a single film in the drawing, the technical idea of the present disclosure is not limited thereto. Unlike the shown example, the dummy gate electrode DGE may be formed by stacking a plurality of conductive materials. For example, the dummy gate electrode DGE may include a work function adjusting film that adjusts the work function, and a filling conductive film that at least partially or completely fills a space formed by the work function adjusting film. The work function adjusting film may include, for example, at least one of TiN, TaN, TiC, TaC, TiAlC, and combinations thereof. The filling conductive film may include, for example, W or Al. Such a dummy gate electrode DGE may be formed, for example, but not limited to, by a replacement process.

A gate dielectric film 120 may be interposed between the first and second active patterns AP1 and AP2 and the dummy gate electrode DGE. For example, the gate dielectric film 120 may extend along the side walls and bottom surface of the dummy gate electrode DGE. However, the technical idea of the present disclosure is not limited thereto, and the gate dielectric film 120 extends along the bottom surface of the dummy gate electrode DGE, but may not extend along the side wall of the dummy gate electrode DGE.

The gate dielectric film 120 may be interposed between the element separation film 105 and the dummy gate electrode DGE. The gate dielectric film 120 may be formed along the profiles of the first and second active patterns AP1 and AP2 protruding above the element separation film 105 and the upper surface of the element separation film 105.

The gate dielectric film 120 may include, for example, at least one of silicon oxide, silicon oxynitride, silicon nitride, and a high dielectric constant (high-k) material having a higher dielectric constant than silicon oxide. The high dielectric constant material may include, for example, but not limited to, hafnium oxide.

A gate spacer 140 may be formed on the substrate 100 and the element separation film 105. The gate spacer 140 may extend along both side walls of the dummy gate electrode DGE. The gate spacer 140 may be placed on long side walls of the dummy gate electrode DGE. For example, the gate spacer 140 may extend in the second direction Y.

The gate spacer 140 may include, for example, but not limited to, at least one of silicon oxide, silicon nitride, silicon oxynitride, and combinations thereof.

The gate capping pattern 150 may extend along the upper surface of the dummy gate electrode DGE. For example, the gate capping pattern 150 may extend in the second direction Y to cover the upper surface of the dummy gate electrode DGE. However, the technical idea of the present disclosure is not limited thereto, and the gate capping pattern 150 may be further placed on the upper surface of the gate spacer 140.

The gate capping pattern 150 may include, for example, but not limited to, at least one of silicon oxide, silicon nitride, silicon oxynitride, and combinations thereof.

Cell separation structures DB extending in the second direction Y and adjacent to each other in the first direction X may be placed. The cell separation structure DB may extend parallel to the dummy gate electrode DGE. A distance between the cell separation structure DB and the dummy gate electrode DGE adjacent to the cell separation structure DB in the first direction X may be substantially equal to the first pitch P1. That is, for example, the width of the power tap cell PTC may be 6 times or more of the first pitch P1.

The power tap cell PTC may be defined by the cell separation structure DB. The power tap cell PTC may be defined between the cell separation structures DB adjacent to each other in the first direction X. The first logic cell LC1 of FIG. 1 may also be defined between the cell separation structures DB adjacent to each other in the first direction X. The power tap cell PTC and the first logic cell LC1 may be electrically separated by the cell separation structure DB.

A first source/drain region SD1 may be placed on the first active pattern AP1. The first source/drain region SD1 may be formed inside the first active pattern AP1 on both sides of the dummy gate electrode DGE. The first source/drain region SD1 may be placed between the dummy gate electrodes DGE adjacent to each other. The first source/drain region SD1 may be spaced apart from the dummy gate electrode DGE by the gate spacer 140. The first source/drain region SD1 may include an epitaxial layer formed inside the first active pattern AP1. In some embodiments, the first active pattern AP1 may share the first source/drain region SD1. For example, the first source/drain region SD1 may be a merged epitaxial layer.

A second source/drain region SD2 may be placed on the second active pattern AP2. The second source/drain region SD2 may be formed inside the second active pattern AP2 on both sides of the dummy gate electrode DGE. The second source/drain region SD2 may be placed between the dummy gate electrodes DGE adjacent to each other. The second source/drain region SD2 may be spaced apart from the dummy gate electrode DGE by the gate spacer 140. The second source/drain region SD2 may include an epitaxial layer formed inside the second active pattern AP2. In some embodiments, the second active pattern AP2 may share the second source/drain region SD2. For example, the second source/drain region SD2 may be a merged epitaxial layer.

The first source/drain region SD1 may include, for example, p-type impurities or impurities for preventing diffusion of p-type impurities, and the second source/drain region SD2 may include n-type impurities or impurities for preventing diffusion of the n-type impurities. For example, the first source/drain region SD1 may include at least one of B, C, In, Ga, and Al or a combination thereof, and the second source/drain region SD2 may include at least one of P, Sb, As or a combination thereof.

A first upper interlayer insulating film 110, a second upper interlayer insulating film 210, a third upper interlayer insulating film 220, and a fourth upper interlayer insulating film 230 may be placed on the first side 100a of the substrate 100. The first to fourth upper interlayer insulating films 110, 210, 220, and 230 may be sequentially stacked on the first side 100a of the substrate 100. The first to fourth upper interlayer insulating films 110, 210, 220, and 230 may include, for example, but not limited to, at least one of silicon oxide, silicon oxynitride, and/or a low dielectric constant (low-k) material having a dielectric constant lower than that of silicon oxide.

The first upper interlayer insulating film 110 and the second upper interlayer insulating film 210 may be formed to cover or overlap the element separation film 105, the first source/drain region SD1, the second source/drain region SD2, the gate spacer 140, and the gate capping pattern 150. For example, the first upper interlayer insulating film 110 is formed on the element separation film 105 and may cover or be on the side wall of the gate spacer 140. The second upper interlayer insulating film 210 is formed on the first upper interlayer insulating film 110 and may cover or overlap the upper surface of the gate capping pattern 150.

The source/drain contact AC may be placed on at least one side of the dummy gate electrode DGE. The source/drain contact AC may be placed between the dummy gate electrode DGE and the cell separation structure DB. The source/drain contact AC penetrates the first and second upper interlayer insulating films 110 and 210, and may be electrically connected to the first and second source/drain regions SD1 and SD2. At least one of the source/drain contacts AC may be a dummy contact. At least one of the source/drain contact AC may not be connected to the first metal layer M1. The source/drain contact AC of the first logic cell LC1 of FIG. 1 may be electrically connected to the first metal layer M1 through a first via that is inside the first metal layer M1. The gate contact electrically connected to the gate electrode of the first logic cell LC1 of FIG. 1 may be electrically connected to the first metal layer M1 through the first via inside the first metal layer M1.

The source/drain contact AC may include a source/drain barrier film 182 and a source/drain filling film 184. The source/drain barrier film 182 may be interposed between the first and second upper interlayer insulating films 110 and 210 and the source/drain filling film 184. For example, the source/drain barrier film 182 may include, but not limited to, at least one of titanium (Ti), tantalum (Ta), tungsten (W), nickel (Ni), cobalt (Co), platinum (Pt), alloys and/or nitrides thereof. For example, the source/drain filling film 184 may include, but not limited to, at least one of aluminum (Al), copper (Cu), tungsten (W), molybdenum (Mo), cobalt (Co), and/or alloys thereof.

A silicide film 165 may be formed between the source/drain contact AC and the first and second source/drain regions SD1 and SD2.

The first metal layer M1 may be placed inside the third upper interlayer insulating film 220. The first metal layer M1 may include a first power rail PR1, a second power rail PR2, and a first wiring MU. The first power rail PR1 and the second power rail PR2 may extend in the first direction X. The first wiring M1_I may be placed between the first power rail PR1 and the second power rail PR2. The first wiring M1_I may extend in the first direction X.

For example, the first wiring MU, the first and second power rails PR1 and PR2, and the first via of the first metal layer M1 may be formed, but not limited to, by a single damascene process. The first wiring MU, the first and second power rails PR1 and PR2 and the first via of the first metal layer M1 may, of course, be formed by a dual damascene process or another wiring process.

The first power rail PR1 may include a first extension part E1 extending in the first direction X and a first expansion part EXP1 having a width greater than the width of the first extension part E1. The width of the first expansion part EXP1 in the second direction Y may be greater than the width of the first extension part E1 in the second direction Y.

The second power rail PR2 may include a second extension part E2 extending in the first direction X and a second expansion part EXP2 having a width greater than the width of the second extension part E2. The width of the second expansion part EXP2 in the second direction Y may be greater than the width of the second extension part E2 in the second direction Y.

In some embodiments, the first distance D1 in the second direction Y between the first expansion part EXP1 and the second expansion part EXP2 may be different from the second distance D2 in the second direction Y between the first extension part E1 and the second extension part E2. In some embodiments, the first distance D1 may be smaller than the second distance D2.

In other words, a third distance D3 in the second direction Y between the second power rail PR2, which is adjacent to the first expansion part EXP1 and defines the boundary of the power tap cell PTC, and the first expansion part EXP1 may be different from a fourth distance D4 in the second direction Y between the second power rail PR2, which is adjacent to the first expansion part EXP1 and defines the boundary of the power tap cell PTC, and the first extension part E1. A fifth distance D5 in the second direction Y between the first power rail PR1, which is adjacent to the second expansion part EXP2 and defines the boundary of the power tap cell PTC, and the second expansion part EXP2 may be different from a sixth distance D6 in the second direction Y between the first power rail PR1, which is adjacent to the second expansion part EXP2 and defines the boundary of the power tap cell PTC, and the second extension part E2. In some embodiments, the third distance D3 may be smaller than the fourth distance D4, and the fifth distance D5 may be smaller than the sixth distance D6. The first distance D1 may be smaller than the third distance D3 and the fifth distance D5.

That is, the first expansion part EXP1 may protrude from both side walls of the first extension part E1 in the second direction Y, and the second expansion part EXP2 may protrude from both side walls of the second extension part E2 in the second direction Y. The first expansion part EXP1 may be placed, for example, at the center of the first extension part E1 in the second direction Y. The second expansion part EXP2 may be placed, for example, at the center of the second extension part E2 in the second direction Y.

The second metal layer M2 may be placed inside the fourth upper interlayer insulating film 230. The second metal layer M2 may include a second wiring M2_I and a second via V2. The second wiring M2_I may extend in the second direction Y. The second wiring M2_I may be electrically connected to the first wiring M1_I through the second via V2.

For example, the second wiring M2_I and the second via V2 of the second metal layer M2 may be formed, but not limited to, by a dual damascene process. Needless to say, the second wiring M2_I and the second via V2 of the second metal layer M2 may be formed by a single damascene process or another wiring process, according to some embodiments.

The first wiring MU, the first and second power rails PR1 and PR2 and the first via of the first metal layer M1, and the second wiring M2_I and the second via V2 of the second metal layer M2 may include, for example, but not limited to, at least one of aluminum (Al), copper (Cu), tungsten (W), molybdenum (Mo), cobalt (Co) and/or alloys thereof. Further, the first wiring MU, the first and second power rails PR1 and PR2 and the first via of the first metal layer M1, and the second wiring M2_I and the second via V2 of the second metal layer M2 may further include, for example, a barrier film. The barrier film may include, for example, but not limited to, at least one of titanium (Ti), tantalum (Ta), tungsten (W), nickel (Ni), cobalt (Co), platinum (Pt), alloys, and/or nitrides thereof.

A power delivery network PDN may be placed on the second side 100b of the substrate 100. The power delivery network PDN may form a wiring network for providing the first and second voltage VDD and VSS to the first and second power rails PR1 and PR2.

Specifically, the power delivery network PDN may include a first lower interlayer insulating film 310, a second lower interlayer insulating film 320, a first lower wiring LM1, a lower via LV, and a second lower wiring LM2. The first lower interlayer insulating film 310 and the second lower interlayer insulating film 320 may be sequentially stacked on the second side 100b of the substrate 100. The first lower wiring LM1 may be placed in the first lower interlayer insulating film 310, and the lower via LV and the second lower wiring LM2 may be placed in the second lower interlayer insulating film 320. The lower via LV may connect the first lower wiring LM1 and the second lower wiring LM2.

In the drawing, the numbers, placements, and the like of the first wiring MU, the second wiring M2_I, the second via V2, the first lower wiring LM1 and the second lower wiring LM2 are merely for convenience of explanation, and are not limited thereto. Further, at least one metal layer may be further placed on the second metal layer M2, and at least one lower wiring may be further placed on the second lower wiring LM2.

The power tap cell PTC may include a first power through via PTSV1 and a second power through via PTSV2. The widths of the first and second power through vias PTSV1 and PTSV2 may be greater than the widths of the first via that is inside the first metal layer M1, the second via V2 and the lower via LV.

The first power through via PTSV1 may be placed between the first dummy active regions DAR1 adjacent to each other in the first direction X. The first power through via PTSV1 may overlap the first expansion part EXP1 in a third direction Z. The first power through via PTSV1 may penetrate the substrate 100 and extend from the power delivery network PDN to the first expansion part EXP1 of the first power rail PR1. The first power through via PTSV1 may penetrate the substrate 100, the element separation film 105 that fills the substrate trench DT, and the first to third upper interlayer insulating films 110, 210, and 220. The first power through via PTSV1 may electrically connect the first lower wiring LM1 and the first expansion part EXP1 of the first power rail PR1. As a result, the power tap cell PTC may apply the first voltage VDD from the power delivery network PDN to the first power rail PR1.

In some embodiments, the width of the first power through via PTSV1 may decrease from the first lower wiring LM1 toward the first power rail PR1. This may be due to the characteristics of the etching process for forming the first power through via PTSV1. For example, the first power through via PTSV1 may be formed by an etching process performed on the second side 100b of the substrate 100.

In some embodiments, the first power through via PTSV1 may penetrate a part of the first power rail PR1. An upper surface US1 of the first power through via PTSV1 in the third direction Z may be placed inside the first expansion part EXP1 of the first power rail PR1. For example, the first power rail PR1 may include a filling film and a barrier film that wraps the filling film, and the upper surface US1 of the first power through via PTS may come into contact with the filling film.

The second power through via PTSV2 may be placed between second dummy active regions DAR2 adjacent to each other in the first direction X. The second power through via PTSV2 may overlap the second expansion part EXP2 in the third direction Z. The second power through via PTSV2 may penetrate the substrate 100 and extend from the power delivery network PDN to the second expansion part EXP2 of the second power rail PR2. The second power through via PTSV2 may penetrate the substrate 100, the element separation film 105 that fills the substrate trench DT, and the first to third upper interlayer insulating films 110, 210, and 220. The second power through via PTSV2 may electrically connect the first lower wiring LM1 and the second expansion part EXP2 of the second power rail PR2. As a result, the power tap cell PTC may apply the second voltage VSS from the power delivery network PDN to the second power rail PR2.

In some embodiments, the width of the second power through via PTSV2 may decrease from the first lower wiring LM1 toward the second power rail PR2. This may be due to the characteristics of the etching process for forming the second power through via PTSV2. For example, the second power through via PTSV2 may be formed by an etching process performed on the second side 100b of the substrate 100.

In some embodiments, the second power through via PTSV2 may penetrate a part of the second power rail PR2. An upper surface US2 of the second power through via PTSV2 in the third direction Z may be placed inside the second expansion part EXP2 of the second power rail PR2. For example, the second power rail PR2 may include a filling film and a barrier film that wraps the filling film, and the upper surface US2 of the second power through via PTSV2 may come into contact with the filling film.

The first and second power through vias PTSV1 and PTSV2 may include a barrier film 172 and a filling film 174. The barrier film 172 may wrap the filling film 174. For example, the barrier film 172 may include, but not limited to, at least one of titanium (Ti), tantalum (Ta), tungsten (W), nickel (Ni), cobalt (Co), platinum (Pt), alloys, and/or nitrides thereof. For example, the filling film 174 may include, but not limited to, at least one of aluminum (Al), copper (Cu), tungsten (W), molybdenum (Mo), cobalt (Co) and/or alloys thereof.

In the semiconductor device according to some embodiments, the first and second power rails PR1 and PR2 may each include the first and second expansion parts EXP1 and EXP2, and each of the first and second expansion parts EXP1 and EXP2 may have a width greater than the first and second power through vias PTSV1 and PTSV2. Widths of each of the first and second expansion parts EXP1 and EXP2 in the first and second directions X and Y may be greater than the widths of each of the first and second power through vias PTSV1 and PTSV2 in the first and second directions X and Y. Therefore, the first and second power through vias PTSV1 and PTSV2 having a relatively large size may be more stably electrically connected to the first and second power rails PR1 and PR2.

Further, referring to FIG. 1, when the power tap cell PTC is a double height cell having a cell height twice that of the first cell height CH1, a single power rail is placed on one power tap cell PTC. For example, when the power tap cell PTC is continuously placed in the first and second rows R1 and R2, the single first power rail PR1 and single first power through via PTSV1 are placed. That is, the single power tap cell PTC includes the single first power through via PTS that provides a first voltage VDD to the first power rail PR1. Therefore, a power tap cell which is a double height cell for providing the first voltage VDD to the first power rail PR1, and a power tap cell which is a double height cell for providing the second voltage VSS to the second power rail PR2 are required. That is, the power tap cells which are two double height cells are required to provide the first and second voltages VDD and VSS to the first power rail PR1 and the second power rail PR2. For example, the power tap cell is placed in a region which is four times as large as that of the first logic cell LC1.

However, in the semiconductor device according to some embodiments, the power tap cell PTC is a triple height cell having a height that is three times that of the first cell height CH1, and may include a first power through via PTSV1 that provides the first power rail PR1 with the first voltage VDD, and a second power through via PTSV2 that provides the second power rail PR2 with the second voltage VSS. For example, the power tap cell is placed in a region that is three times as large as that of the first logic cell LC1. Therefore, an area occupied by the power tap cell PTC in the semiconductor device can decrease.

Figure 5:
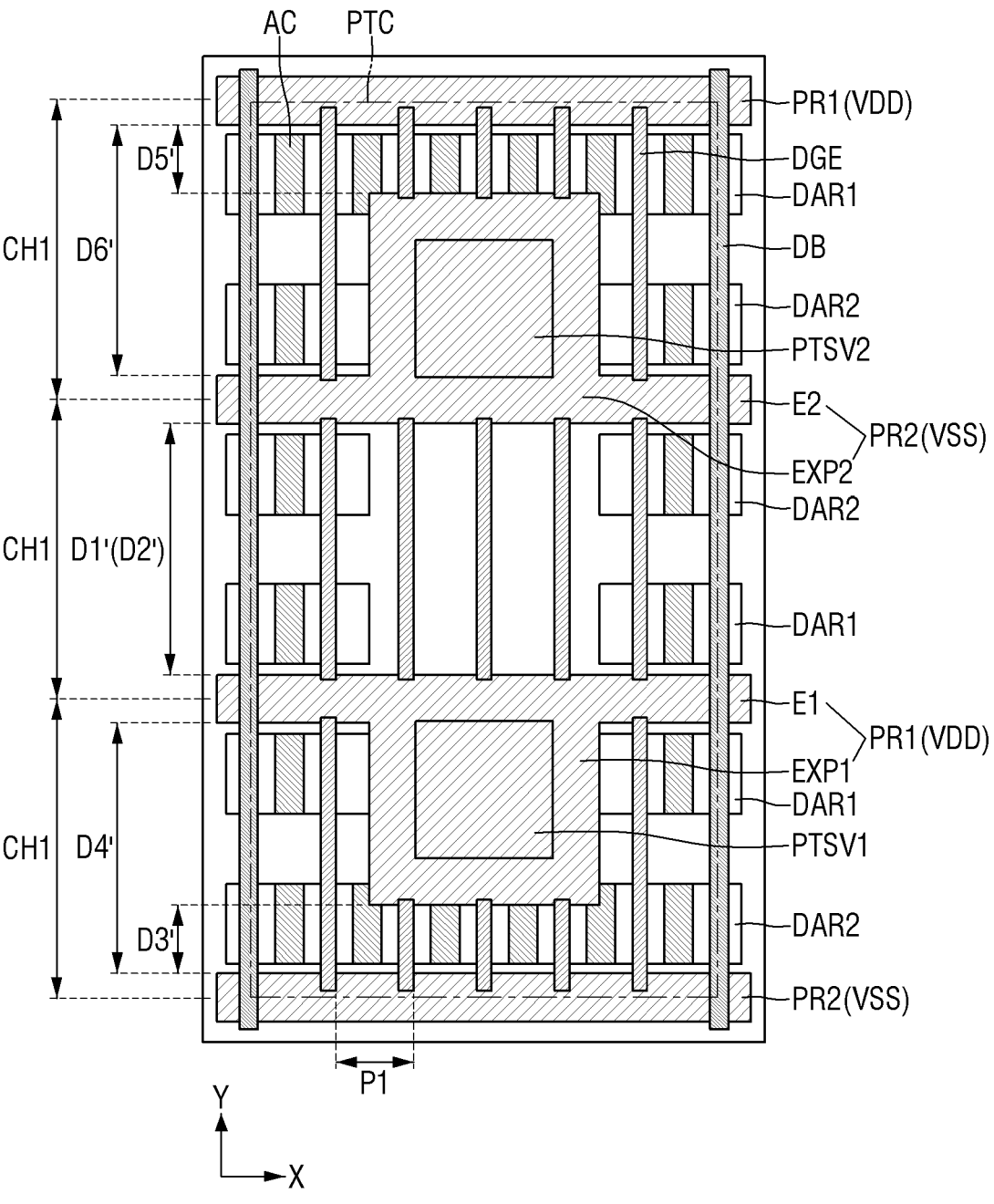
FIG. 5 is a diagram for explaining a semiconductor device according to some embodiments.

FIG. 5 is a diagram for explaining the semiconductor device according to some embodiments. For reference, FIG. 5 is a schematic layout diagram of the power tap cell of FIG. 1. For convenience of explanation, points different from those described using FIGS. 1 to 4 will be mainly described.

Referring to FIG. 5, in the power tap cell PTC of the semiconductor device according to some embodiments, a first distance D1' in the second direction Y between the first expansion part EXP1 and the second expansion part EXP2 may be substantially equal to a second distance D2' in the second direction Y between the first extension part E1 and the second extension part E2.

In other words, a third distance D3' in the second direction Y between the second power rail PR2, which is adjacent to the first expansion part EXP1 and defines the boundary of the power tap cell PTC, and the first expansion part EXP1 may be smaller than a fourth distance D4' in the second direction Y between the second power rail PR2, which is adjacent to the first expansion part EXP1 and defines the boundary of the power tap cell PTC, and the first extension part E1. A fifth distance D5' in the second direction Y between the first power rail PR1 that is adjacent to the second expansion part EXP2 and defines the boundary of the power tap cell PTC and the second expansion part EXP2 may be smaller than a sixth distance D6' in the second direction Y between the first power rail PR1 that is adjacent to the second expansion part EXP2 and defines the boundary of the power tap cell PTC and the second extension part E2. The first distance D1' may be larger than the third distance D3' and the fifth distance D5'.

That is, the first expansion part EXP1 may protrude from one side wall of the first extension part E1 in the second direction Y, and the second expansion part EXP2 may protrude from one side wall of the second extension part E2 in the second direction Y. The other side wall of the first extension part E1 in the second direction Y may be substantially coplanar with the first expansion part EXP1, and the other side wall of the second extension part E2 may be substantially coplanar with the second expansion part EXP2. The other side wall of the first extension part E1 in the second direction Y and the other side wall of the second extension part E2 in the second direction Y may be opposite to each other.

Accordingly, the distance D1' between the first expansion part EXP1 and the second expansion part EXP2 and the distance between the first power through via PTSV1 and the second power through via PTSV2 may further increase.

Figure 6:
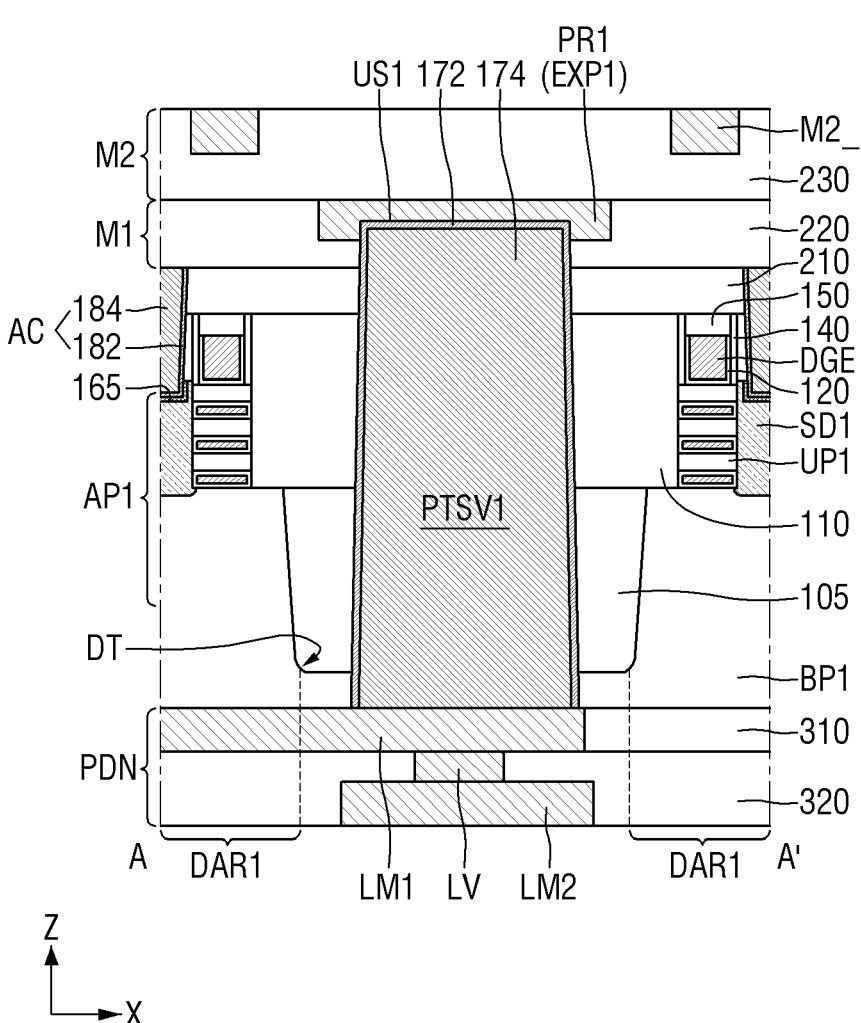
FIGS. 6 and 7 are diagrams for explaining a semiconductor device according to some embodiments.
Figure 7:
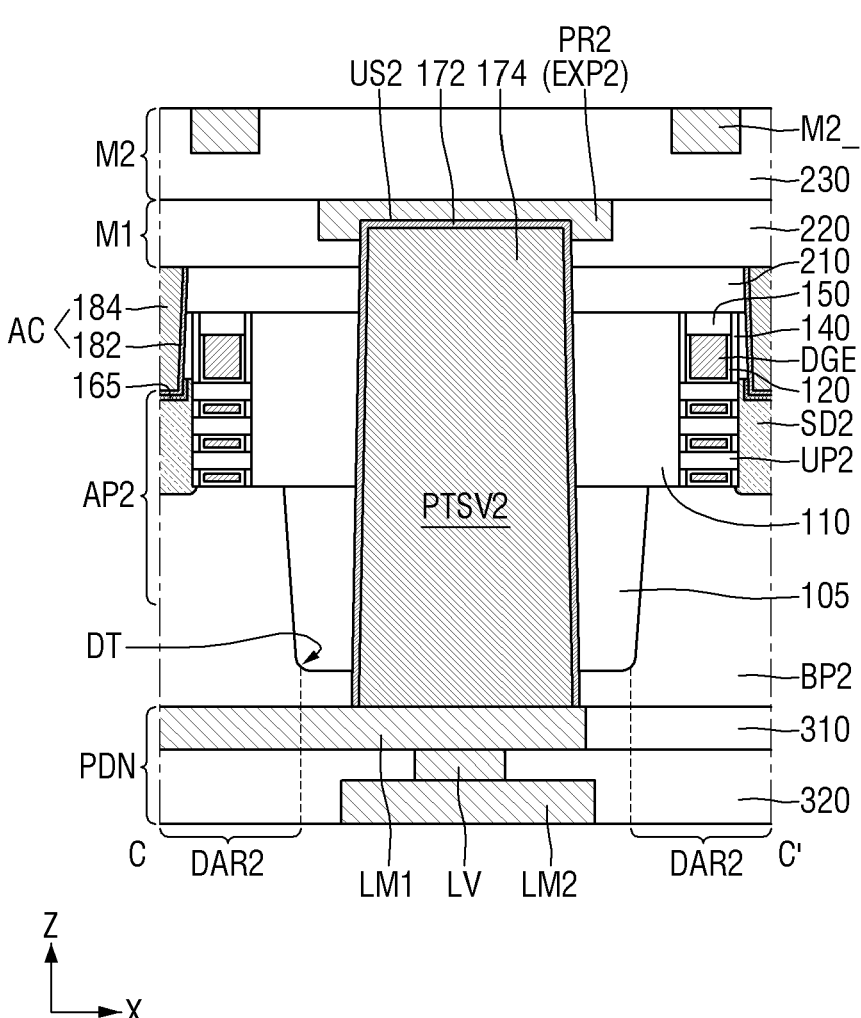

FIGS. 6 and 7 are diagrams for explaining a semiconductor device according to some embodiments. For reference, FIG. 6 is a cross-sectional view taken along A-A' of FIG. 2, and FIG. 7 is a cross-sectional view taken along C-C' of FIG.

2. For convenience of explanation, points different from those described using FIGS. 1 to 5 will be mainly described.

Referring to FIGS. 6 and 7, in the power tap cell PTC according to some embodiments, the first active pattern AP1 may include a first lower pattern BP1 and a plurality of first upper patterns UP1. The second active pattern AP2 may include a second lower pattern BP2 and a plurality of second upper patterns UP2.

The first lower pattern BP1 and the second lower pattern BP2 may protrude from the first side 100a of the substrate 100 as shown in FIG. 3. The plurality of first upper patterns UP1 may be spaced apart from the first lower pattern BP1 in the third direction Z. The plurality of first upper patterns UP1 are sequentially stacked on the first lower pattern BP1 and may be spaced apart from each other in the third direction Z. The plurality of second upper patterns UP2 are sequentially stacked on the second lower pattern BP2, and may be spaced apart from the second lower pattern BP2 in the third direction Z. The plurality of second upper patterns UP2 may be spaced apart from each other in the third direction Z.

The plurality of first upper patterns UP1 and the plurality of second upper patterns UP2 may penetrate the dummy gate electrode DGE. The dummy gate electrode DGE may surround the outer peripheral surfaces of the plurality of first upper pattern UP1 and the plurality of second upper pattern UP2. The gate dielectric film 120 may be placed between the plurality of first and second upper patterns UP1 and UP2 and the dummy gate electrode DGE. The gate dielectric film 120 may surround the outer peripheral surfaces of the plurality of first upper patterns UP1 and the plurality of second upper patterns UP2.

Referring to FIG. 6, the gate spacer 140 may be placed between the first upper pattern UP1 placed at the uppermost part among the plurality of first upper patterns UP1 and the first source/drain region SD1. The gate spacer 140 may not be placed on the first upper pattern UP1 except the first upper pattern UP1 placed at the uppermost part among the plurality of first upper patterns UP1. That is, the inner spacer is omitted and only the outer spacer may exist on the first upper pattern UP1.

Referring to FIG. 7, the gate spacer 140 may be placed between the plurality of second upper patterns UP2 and the second source/drain region SD2. The gate spacer 140 on the second upper pattern UP2 placed at the uppermost part among the plurality of second upper patterns UP2 may be an outer spacer, and the gate spacer 140 on the second upper pattern UP2 except the second upper pattern UP2 placed at the uppermost part among the plurality of second upper patterns UP2 may be an inner spacer. The structure of the inner spacer may be the same as or different from that of the outer spacer.

Although the cross sections of the plurality of first upper patterns UP1 and the plurality of second upper patterns UP2 are shown to be a rectangle in the drawing, this is merely an example. For example, the cross sections of the plurality of first upper patterns UP1 and the plurality of second upper patterns UP2 may be different polygons or circles, respectively. In some embodiments, unlike those shown, the widths of the plurality of first upper patterns UP1 and the plurality of second upper patterns UP2 may decrease as they go away from the first side 100a of the substrate 100.

Although three each of the plurality of first upper patterns UP1 and the plurality of second upper patterns UP2 are shown in the drawing, this is merely an example.

Figure 8:
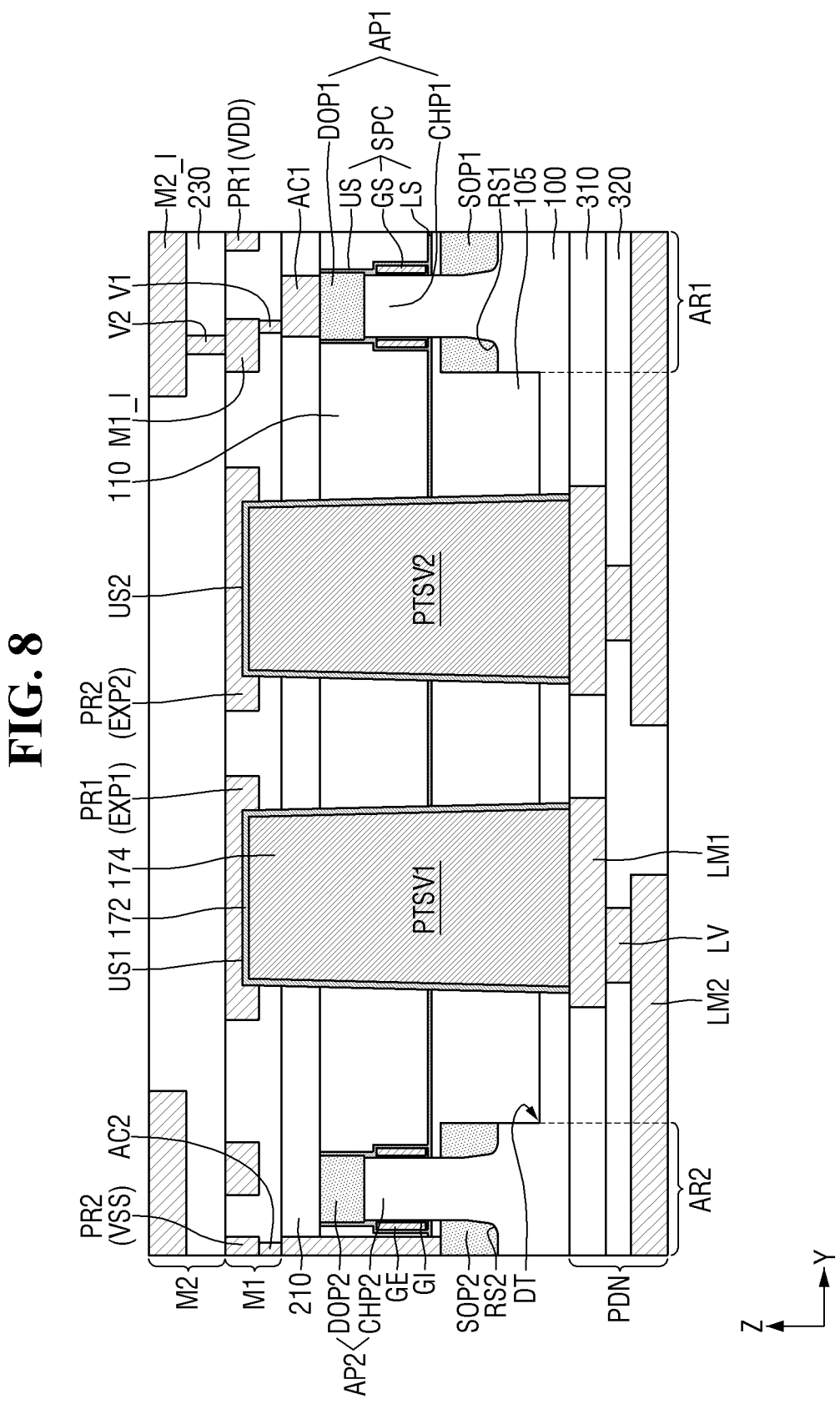
FIG. 8 is a diagram for explaining the semiconductor device according to some embodiments.

FIG. 8 is a diagram for explaining a semiconductor device according to some embodiments. For convenience of explanation, points different from those described using FIGS. 1 to 5 will be mainly described.

Referring to FIG. 8, the semiconductor device according to some embodiments may include vertical transistors (Vertical FET) and wirings that connect the vertical transistors to each other.

The substrate 100 may include a first active region AR1 and a second active region AR2. The first and second active regions AR1 and AR2 may be defined by the substrate trench DT formed on the upper part of the substrate 100.

A first lower epi-pattern SOP1 may be provided on the first active region AR1, and a second lower epi-pattern SOP2 may be provided on the second active region AR2. From a planar point of view, the first lower epi-pattern SOP1 may overlap the first active region AR1, and the second lower epi-pattern SOP2 may overlap the second active region AR2. The first and second lower epitaxial patterns SOP1 and SOP2 may be epitaxial patterns formed by a selective epitaxial growth process. The first lower epi-pattern SOP1 may be provided inside a first recess region RS1 of the substrate 100, and the second lower epi-pattern SOP2 may be provided inside a second recess region RS2 of the substrate 100.

The first active patterns AP1 may be provided on the first active region AR1, and the second active patterns AP2 may be provided on the second active region AR2. Each of the first and second active patterns AP1 and AP2 may have the form of fins protruding vertically. From a planar point of view, each of the first and second active patterns AP1 and AP2 may have the form of a bar extending in the second direction Y.

Each first active pattern AP1 may include a first channel pattern CHP1 protruding vertically from the first lower epi-pattern SOP1, and a first upper epi-pattern DOP1 on the first channel pattern CHP1. Each second active pattern AP2 may include a second channel pattern CHP2 protruding vertically from the second lower epi-pattern SOP2, and a second upper epi-pattern DOP2 on the second channel pattern CHP2.

The element separation film 105 may be provided on the substrate 100 to at least partially or completely fill the substrate trench DT. The element separation film 105 may cover or overlap the upper surfaces of the first and second lower epi-patterns SOP1 and SOP2. The first and second active patterns AP1 and AP2 may protrude vertically above the element separation film 105.

A gate electrode GE may be provided on the element separation film 105. The gate electrode GE may wrap the first channel pattern CHP1 of the first active pattern AP1, and may wrap the second channel pattern CHP2 of the second active pattern AP2. A gate dielectric pattern GI may be interposed between the gate electrode GE and each of the first and second channel patterns CHP1 and CHP2. The gate dielectric pattern GI may cover or overlap the bottom surface of the gate electrode GE and the inner wall of the gate electrode GE. For example, the gate dielectric pattern GI may directly cover or overlap the side walls of the first and second active patterns AP1 and AP2.

The first and second upper epi-patterns DOP1 and DOP2 may protrude vertically above the gate electrode GE. The upper surface of the gate electrode GE may be lower than the bottom surfaces of each of the first and second upper epi-patterns DOP1 and DOP2. In other words, each of the first and second active patterns AP1 and AP2 may have a structure that protrudes vertically from the substrate 100 and penetrates the gate electrode GE.

The semiconductor device according to some embodiments may include vertical transistors in which carriers move in the third direction Z. For example, when a voltage is applied to the gate electrode GE and the transistor "turns on", carriers may move from the lower epi-patterns SOP1 and SOP2 to the upper epi-patterns DOP1 and DOP2 through the channel patterns CHP1 and CHP2. The gate electrode GE according to some embodiments may completely surround side walls of the channel patterns CHP1 and CHP2. The transistor according to the present disclosure may be a three-dimensional field effect transistor (e.g., VFET) having a gate all-around structure. Since the gate surrounds the channel, the semiconductor device according to the disclosure may have excellent electrical properties.

A spacer SPC that covers or is on the gate electrode GE and the first and second active patterns AP1 and AP2 may be provided on the element separation film 105. The spacer SPC may contain a silicon nitride film or a silicon oxynitride film. The spacer SPC may include a lower spacer LS, an upper spacer US, and a gate spacer GS between the lower and upper spacers LS and US.

The lower spacer LS may directly cover or overlap the upper surface of the element separation film 105. The lower spacer LS may separate the gate electrodes GE from the element separation film 105 in the third direction Z. The gate spacer GS may cover or overlap the upper surfaces and the outer walls of each of the gate electrodes GE. The upper spacer US may cover or overlap the first and second upper epi-patterns DOP1 and DOP2. However, the upper spacer US does not cover or overlap the upper surfaces of the first and second upper epi-patterns DOP1 and DOP2, and may expose the upper surfaces.

The first upper interlayer insulating film 110 may be provided on the spacer SPC. The upper surface of the first upper interlayer insulating film 110 may be substantially coplanar with the upper surfaces of the first and second upper epi-patterns DOP1 and DOP2. Second to fourth upper interlayer insulating films 210, 220, and 230 may be sequentially stacked on the first upper interlayer insulating film 110. The second upper interlayer insulating film 210 may cover or overlap the upper surfaces of the first and second upper epi-patterns DOP1 and DOP2.

At least one first active contact AC1 that penetrates the second upper interlayer insulating film 210 and is connected to the first and second upper epi-patterns DOP1 and DOP2 may be provided. At least one second active contact AC2 which sequentially penetrates the second upper interlayer insulating film 210, the first upper interlayer insulating film 110, the lower spacer LS, and the element separation film 105 and is connected to the first and second upper epi-patterns DOP1 and DOP2 may be provided. A gate contact that sequentially penetrates the second upper interlayer insulating film 210, the first upper interlayer insulating film 110, and the gate spacer GS and is connected to the gate electrode GE may be provided. The upper surfaces of the first and second active contacts AC1 and AC2 and the gate contact may be substantially coplanar with the upper surface of the second upper interlayer insulating film 210. The first metal layer M1 may be provided inside the third upper interlayer insulating film 220. The second metal layer M2 may be provided inside the fourth upper interlayer insulating film 230.

A power delivery network PDN may be provided on the lower side of the substrate 100. The power delivery network PDN and the first expansion part EXP1 of the first power rail PR1 may be connected through the first power through via PTSV1. The power delivery network PDN and the second expansion part EXP2 of the second power rail PR2 may be connected through the second power through via PTSV2.

Although the semiconductor device according to some embodiments is shown to include a vertical transistor, this is only an example. For example, the semiconductor device according to some embodiments may include a tunneling transistor (tunneling FET), CFET (Complementary FET), a three-dimensional (3D) transistor, a bipolar junction transistor, a laterally diffused metal oxide semiconductor (LD-MOS), and the like.

Figure 9:
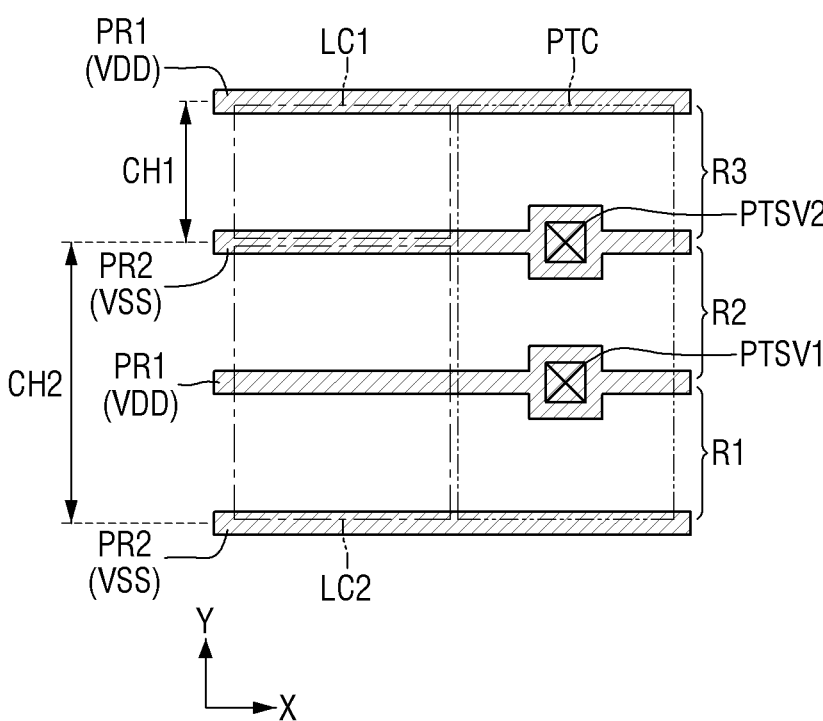
FIGS. 9 to 11 are schematic plan views of a semiconductor device according to some embodiments.
Figure 10:
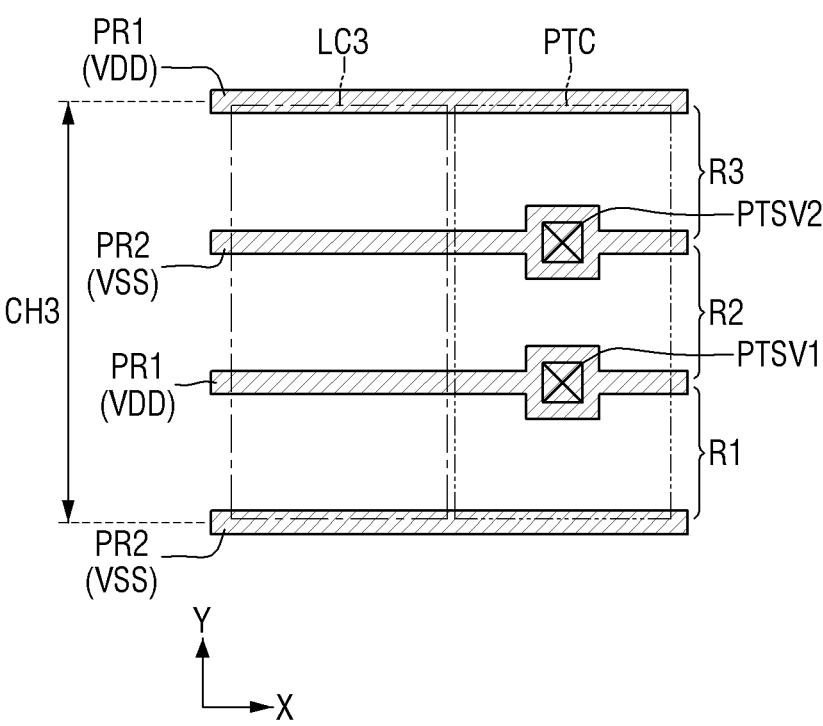
Figure 11:
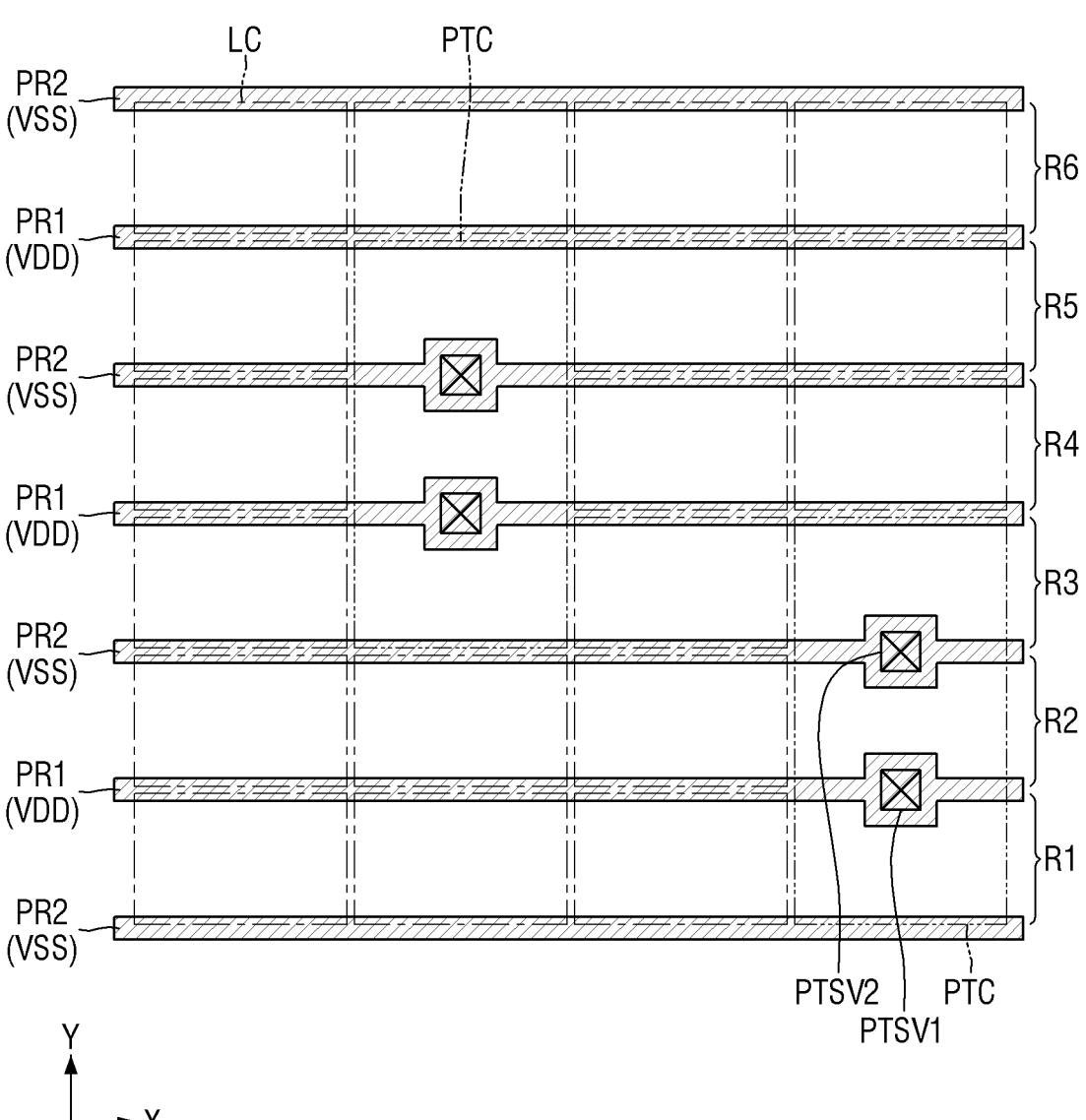

FIGS. 9 to 11 are schematic plan views of a semiconductor device according to some embodiments. For convenience of explanation, points different from those described using FIGS. 1 to 8 will be mainly described.

Referring to FIG. 9, the semiconductor device according to some embodiments may include a first logic cell LC1, a second logic cell LC2, and a power tap cell PTC. The first and second logic cells LC1 and LC2 may be adjacent to the power tap cell PTC in the first direction X or the second direction Y.

The second logic cell LC2 may be continuously placed in two rows adjacent to each other. For example, the second logic cell LC2 may be continuously placed in the first row R1 and the second row R2. The second logic cell LC2 may have a second cell height CH2 that is twice the first cell height CH1. That is, the second logic cell LC2 may be a double height cell.

Referring to FIG. 10, the semiconductor device according to some embodiments may include a third logic cell LC3 and a power tap cell PTC. The third logic cell LC3 may be adjacent to the power tap cell PTC in the first direction X or the second direction Y.

The third logic cell LC3 may be continuously placed in two rows adjacent to each other. For example, the third logic cell LC3 may be continuously placed in the first to third rows R1, R2 and R3. The third logic cell LC3 may have a third cell height CH3 that is three times the first cell height CH1. That is, the third logic cell LC3 may be a triple height cell.

Referring to FIG. 11, the semiconductor device according to some embodiments may include a plurality of power tap cells PTC and a plurality of logic cells LC. At least one logic cell LC may be placed between the plurality of power tap cells PTC. For example, the power tap cells PTC may not be closest to each other. The plurality of logic cells LC may be adjacent to each of the plurality of power tap cells PTC.

Figure 12:
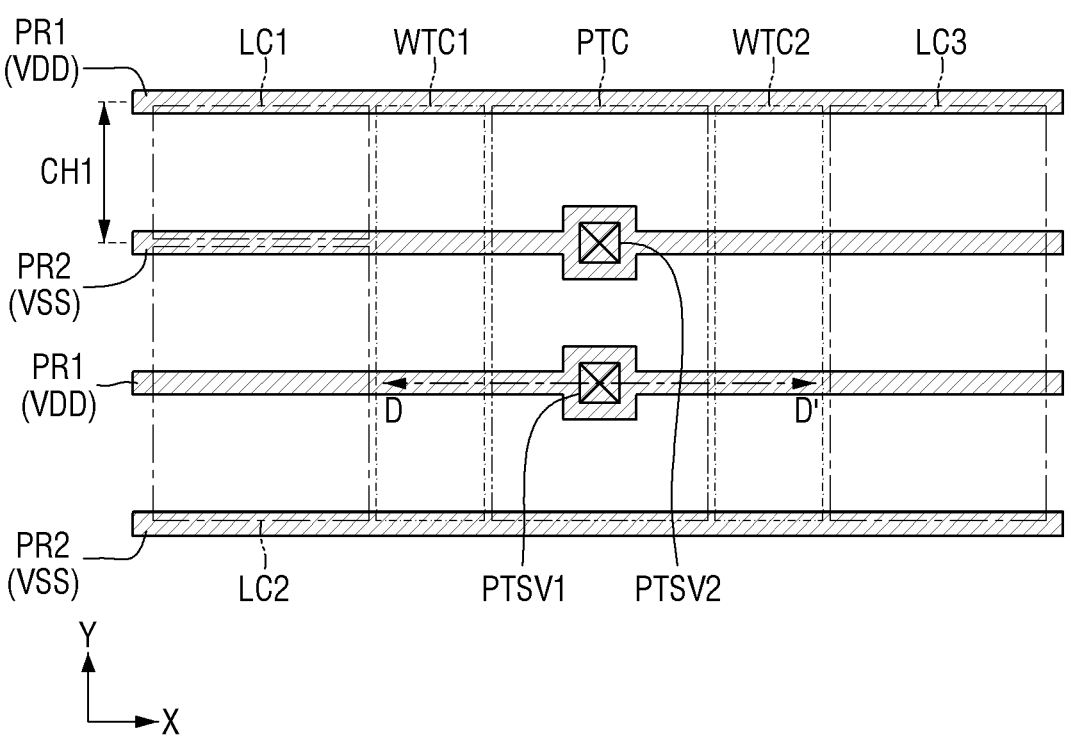
FIG. 12 is a diagram for explaining the semiconductor device according to some embodiments.
Figure 13:
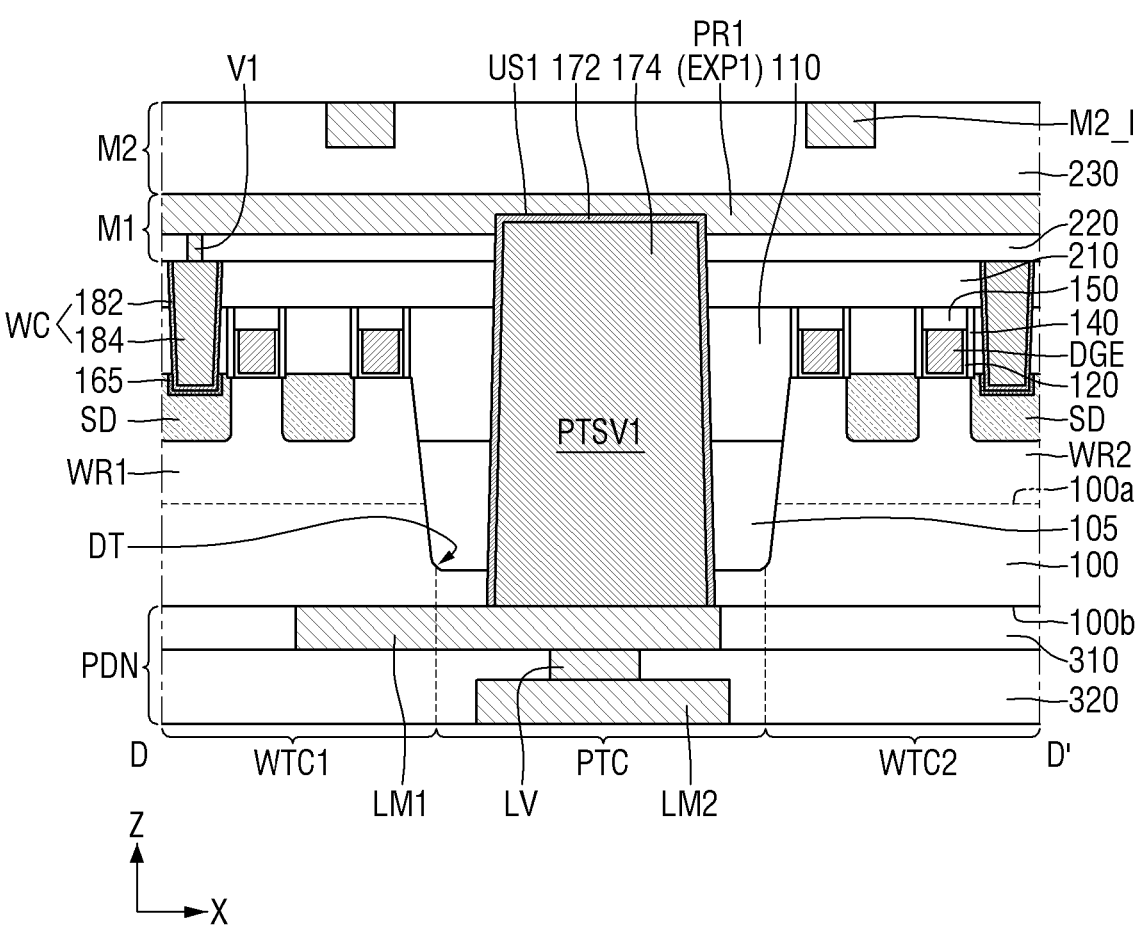
FIG. 13 is a cross-sectional view taken along a line D-D' of FIG. 12.

FIG. 12 is a diagram for explaining a semiconductor device according to some embodiments. FIG. 13 is a cross-sectional view taken along a line D-D' of FIG. 12.

Referring to FIGS. 12 and 13, the semiconductor device according to some embodiments may include first to third logic cells LC1, LC2, and LC3 having different cell heights from each other and a power tap cell PTC.

The semiconductor device according to some embodiments may further include first and second well tap cells WTC1, WTC2. For example, the first well tap cell WTC1 may be placed on one side of the power tap cell PTC, and the second well tap cell WTC2 may be placed on the other side of the power tap cell PTC.

The first and second well tap cells WTC1 and WTC2 may include a well contact WC. For example, the well contact WC may be connected to the first power rail PR1 through the first via V1 to provide a first voltage to the first well region WR1. That is, the first well tap cell WTC1 may provide a voltage to the first well region WR1 through the well contact WC, and the second well tap cell WTC2 may provide a voltage to the second well region WR2 through the well contact WC.

Figure 14:
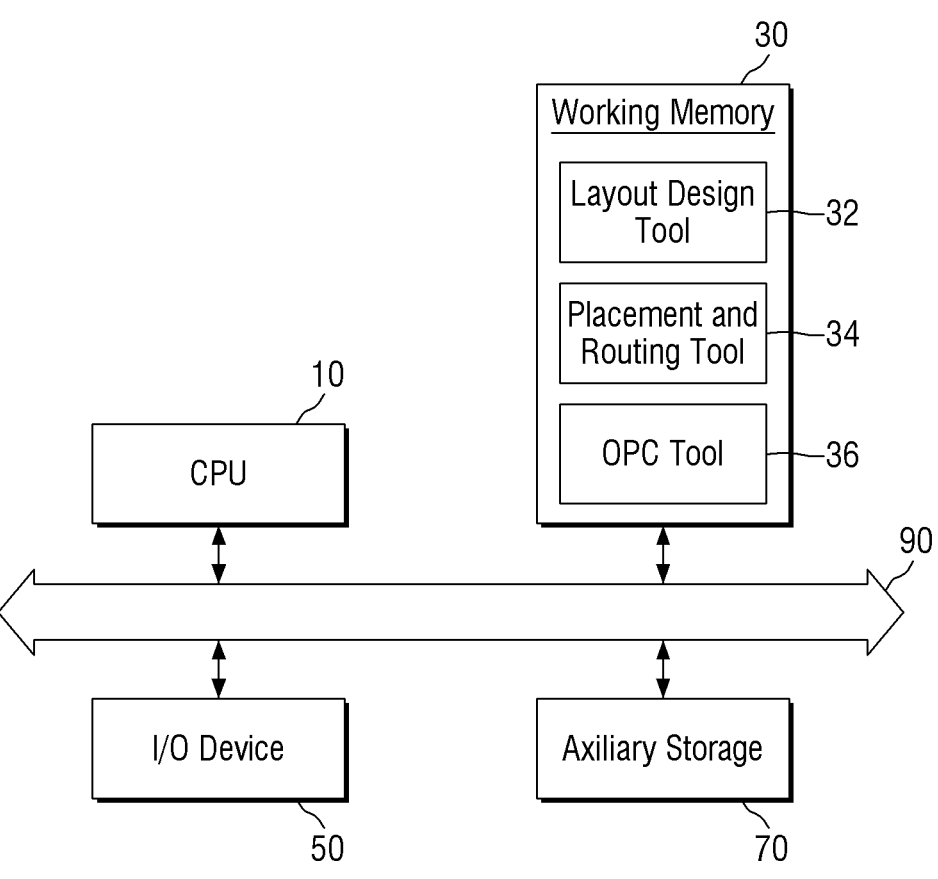
FIG. 14 is a block diagram of a computer system for performing a layout design of the semiconductor device according to some embodiments.

FIG. 14 is a block diagram of a computer system for performing a layout design of the semiconductor device according to some embodiments.

Referring to FIG. 14, the computer system may include a CPU 10, a working memory 30, an I/O device 50, and an auxiliary storage 70. Here, the computer system may be provided as a dedicated device for the layout design of the semiconductor device according to some embodiments. In some embodiments, the computer system may include various design and verification simulation programs.

The CPU 10 may execute software (application program, operating system, and device drivers) to be executed by the computer system. The CPU 10 may execute an operating system loaded into the working memory 30. The CPU 10 may execute various application programs to be driven on the basis of the operating system. For example, the CPU 10 may execute a layout design tool 32, a placement and routing tool 34 and/or an optical proximity correction (OPC) tool 36 loaded into the working memory 30.

The aforementioned operating system or application programs may be loaded into the working memory 30. The operating system image stored in the auxiliary storage 70 may be loaded into the working memory 30 on the basis of the booting sequence, when the computer system boots up. The operating system may support various I/O operations of the computer system.

The layout design tool 32 for layout design of the semiconductor device according to some embodiments may be loaded from the auxiliary storage 70 into the working memory 30. Subsequently, the placement and routing tool 34 which places the designed standard cells, rearranges the internal wiring pattern in the placed standard cells, and routes the placed standard cells, may be loaded from the auxiliary storage 70 into the working memory 30. Subsequently, the OPC tool 36 that performs optical proximity correction (OPC) on the designed layout data may be loaded from the auxiliary storage 70 into the working memory 30.

The I/O device 50 may control the user input and output from the user interface devices. For example, the I/O device 50 may receive input of information from the user, by including a keyboard or a monitor. The user may receive input of information about semiconductor region or data paths that require tuned operating properties, using the I/O device 50. In addition, the processing procedure, processing results and the like of the OPC tool 36 may be displayed through the I/O device 50.

The auxiliary storage 70 may be provided as a storage medium of the computer system. The auxiliary storage 70 may store application programs, an operating system image, and various data.

A system interconnector 90 may be a system bus for providing a network inside the computer system. The CPU 10, the working memory 30, the I/O device 50, and the auxiliary storage 70 may be electrically connected and data may be exchanged between each other through the system interconnector 90.

Figure 15:
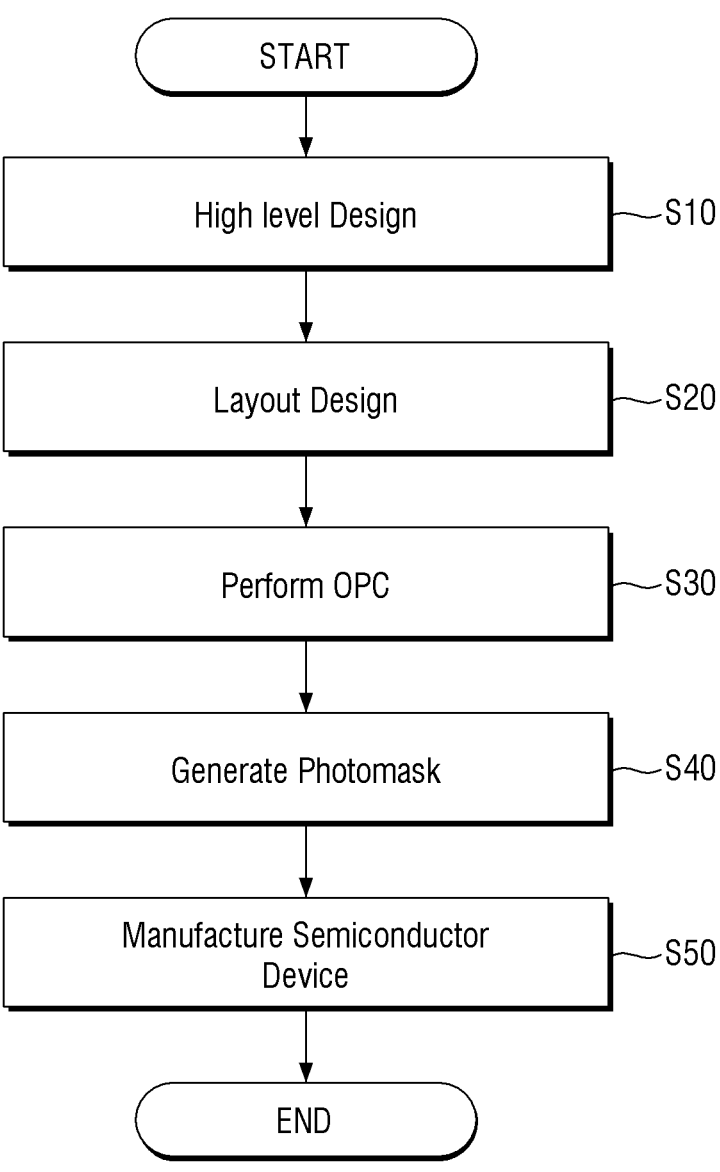
FIG. 15 is a flowchart for explaining a layout design method and a fabricating method of the semiconductor device according to some embodiments.
Figure 16:
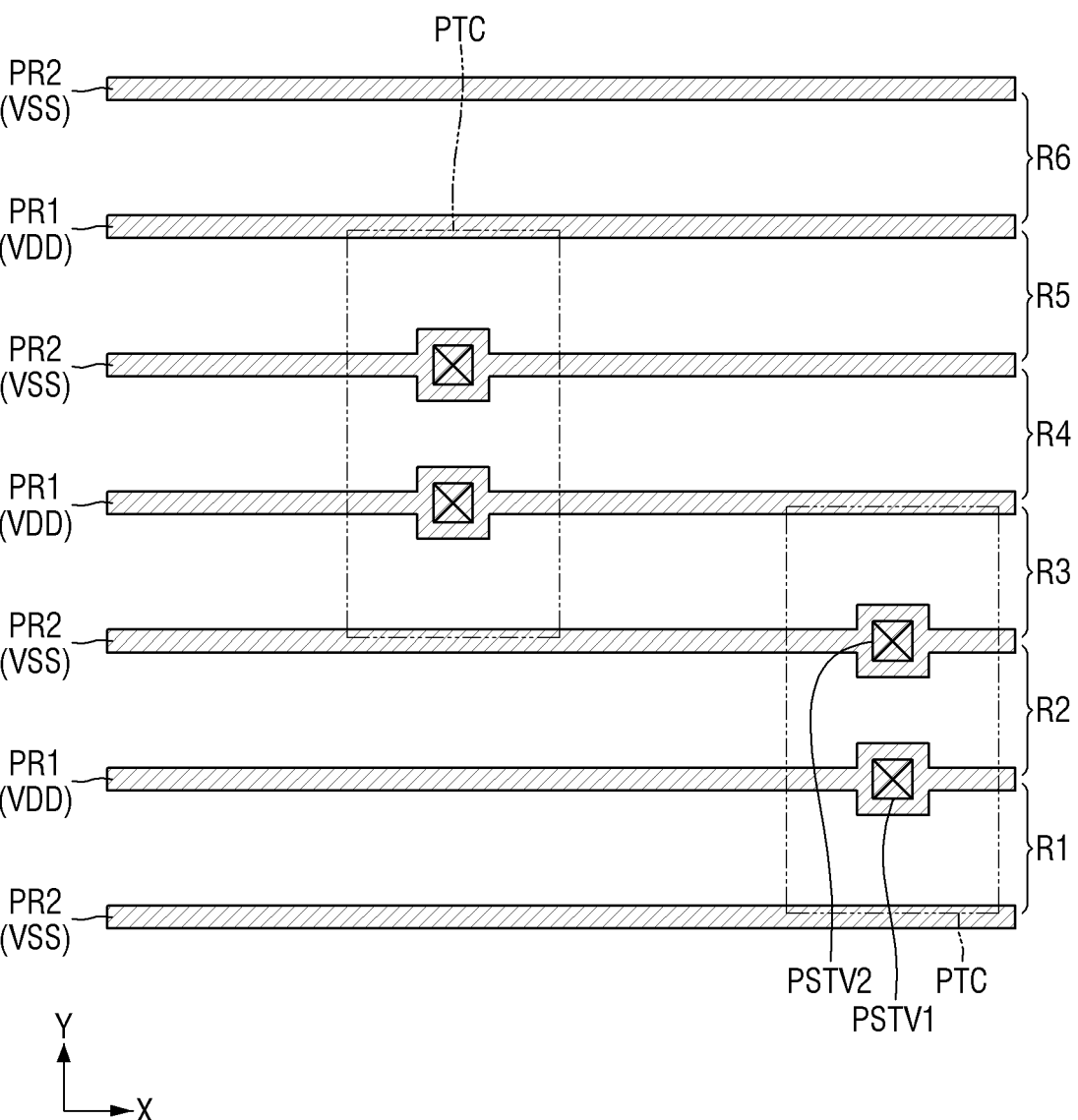
FIGS. 16 and 17 are diagrams for explaining a method of designing the semiconductor device according to some embodiments.
Figure 17:
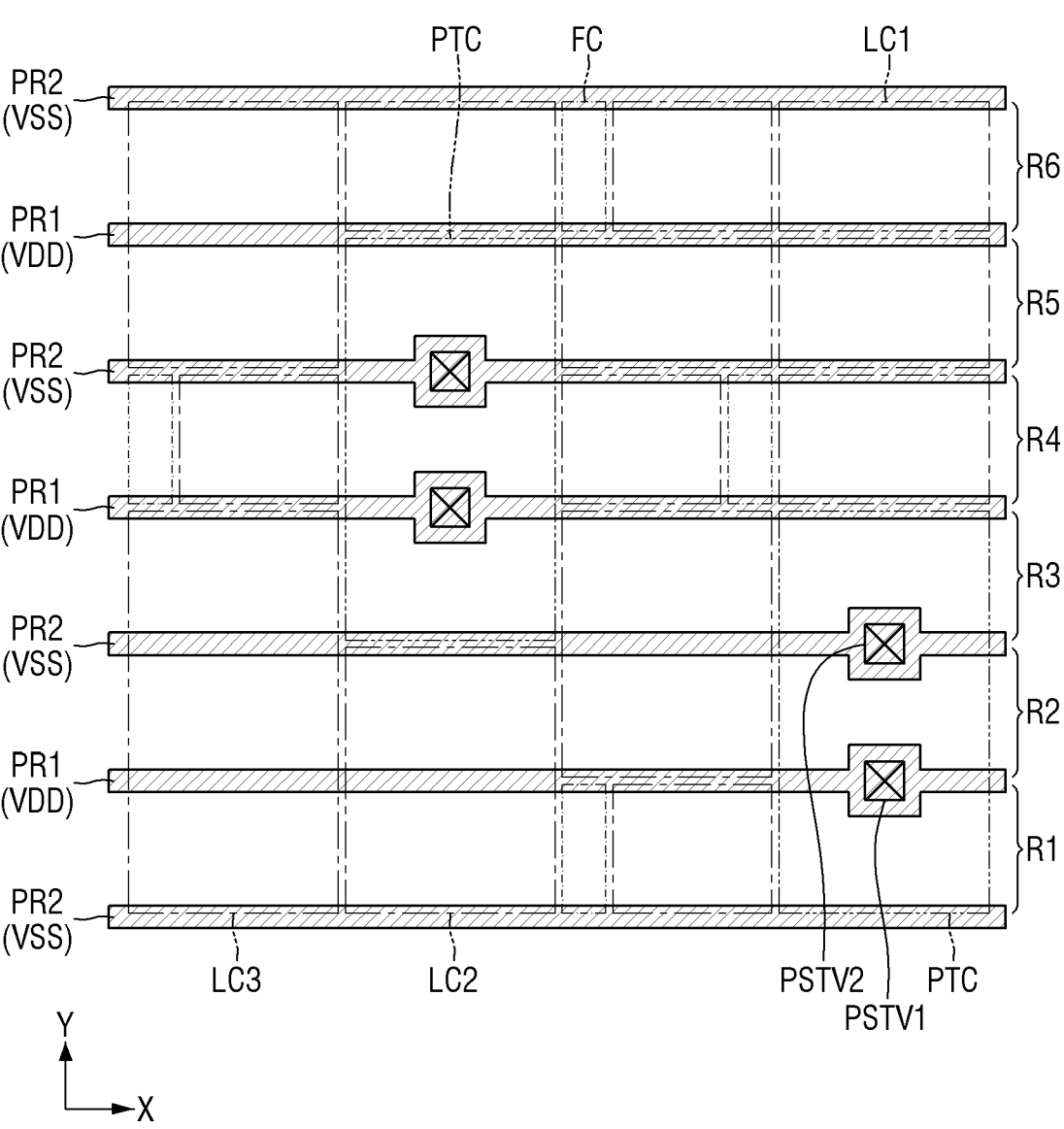

FIG. 15 is a flowchart for explaining a layout design method and a fabricating method of the semiconductor device according to some embodiments. FIGS. 16 and 17 are diagrams for explaining a method of designing the semiconductor device according to some embodiments.

Referring to FIG. 15, a high level design of a semiconductor integrated circuit may be performed, using the computer system described above using FIG. 14 (S10). The high level design may include description of the integrated circuit to be designed in the parent language of a computer language. For example, a parent language such as C language may be used in the high level design. Circuits designed by the high level design may be expressed more specifically by register transfer level (RTL) coding or simulation. Subsequently, the code generated by the register transfer level coding is converted into Netlist and may be synthesized by the entire semiconductor device. The synthesized schematic circuit is verified by the simulation tool, and the adjustment procedure may be accompanied according to the verification result.

Subsequently, a layout design for implementing the logically completed integrated circuit on a silicon substrate may be performed (S20). For example, the layout design may be performed, by referring to the schematic circuit synthesized by the high level design or Netlist corresponding thereto. The layout design may include routing procedures for placing and connecting various standard cells provided by cell library in accordance with the defined design rules.

The layout may be a procedure which defines the form and size of a pattern for forming the transistor and the metal wirings to be actually formed on the silicon substrate. For example, in order to actually form an inverter circuit on the silicon substrate, PFET, NFET, P-WELL, N-WELL, a gate electrode, and layout patterns such as wiring patterns placed on them may be appropriately placed. Next, the selected and placed standard cells may be routed. Specifically, the upper wirings (routing patterns) may be placed on the placed standard cells. By performing the routing, the placed standard cells may be interconnected according to the design.

After routing, the layout may be verified whether there are any parts that violate the design rule. Items to be verified may include a DRC (Design Rule Check), an ERC (Electronical Rule Check), a LVS (Layout vs Schematic), and the like.

For example, referring to FIG. 16, the first and second power rails PR1 and PR2 may be placed on the layout. The first power rail PR1 and the second power rail PR2 may extend in the first direction X and be alternately placed along the second direction Y at a constant pitch.

The power tap cell PTC may be placed at a position where supply of voltage is required for the first and second power rails PR1 and PR2. The power tap cell PTC may be placed continuously in three adjacent rows. For example, the power tap cell PTC may be placed continuously in the first to third rows R1, R2, and R3, and may be placed continuously in the third to fifth rows R3, R4 and R5. The power tap cell PTC may not be placed, for example, to be closest to each other. That is, the boundaries of the different power tap cells PTC may not be in contact with each other.

Referring to FIG. 17, the first to third logic cells LC1, LC2, and LC3 and the filler cell FC may be placed. The first to third logic cells LC1, LC2, and LC3 may be placed in a region in which the power tap cell PTC is not placed. The first to third logic cells LC1, LC2, and LC3 may be placed on the layout along the designed circuit. The filler cell FC may fill an empty space of the region in which the first to third logic cells LC1, LC2, and LC3 and the power tap cell PTC are not placed. The filler cell FC may be a dummy cell. That is, the power tap cell PTC may be adjacent to at least one of the first to third logic cells LC1, LC2, and LC3 or the filler cell FC. Further, the power tap cells PTC may be adjacent to each other.

Next, routing for connecting the first to third logic cells LC1, LC2, and LC3 to each other may be performed. A semiconductor device may be implemented on a substrate, by manufacturing a mask for each layer on the basis of the layout in which routing is completed.

Subsequently, referring to FIG. 15, an optical proximity correction (OPC) procedure may be performed (S30). The layout patterns provided through the layout design may be implemented on the silicon substrate, using a photolithography process. At this time, the optical proximity correction may be a technique for correcting a distortion phenomenon that may occur in the photolithography process.

Subsequently, a photomask may be manufactured on the basis of the layout changed by the optical proximity correction (S40). The photomask may be manufactured, for example, in a manner of depicting the layout patterns, using a chrome film coated on the glass substrate.

Subsequently, a semiconductor device may be fabricated, using the generated photomask (S50). In the fabricating process of the semiconductor device using a photomask, various types of exposure and etching processes may be repeated. Through such processes, the shape of the patterns formed at the time of layout design may be continuously formed on the silicon substrate.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense and not for purposes of limitation.

What is claimed is:

1. A semiconductor device comprising:
a substrate comprising a first side and a second side that are opposite to each other;
a power tap cell in a first row, a second row adjacent to the first row, and a third row adjacent to the second row, on the first side of the substrate;
a first power rail and a second power rail that are on the power tap cell, extend in a first direction, and are spaced apart from each other in a second direction, wherein:
the first power rail comprises a first extension part that extends in the first direction, and a first expansion part that has a first width greater than a second width of the first extension part in the second direction, and
the second power rail comprises a second extension part that extends in the first direction, and a second expansion part that has a third width greater than the second width of the first extension part in the second direction; and
a power delivery network on the second side of the substrate,
wherein the power tap cell comprises:
a first power through via that penetrates the first side of the substrate and extends from the power delivery network to the first power rail, wherein the first power through via is connected to the first extension part; and
a second power through via that penetrates the first side of the substrate and extends from the power delivery network to the second power rail, wherein the second power through via is connected to the second extension part.

2. The semiconductor device of claim 1,
wherein the first power rail extends along a boundary between the first row and the second row, and
wherein the second power rail extends along a boundary between the second row and the third row.

3. The semiconductor device of claim 1, wherein a distance from the first extension part to the second extension part in the second direction is greater than a distance from the first power through via to the second power through via in the second direction.

4. The semiconductor device of claim 1, wherein a distance from the first extension part to the second extension part in the second direction is equal to a distance from the first power through via to the second power through via in the second direction.

5. The semiconductor device of claim 1, further comprising:
a logic cell in the first row on the first side of the substrate,
wherein the logic cell is configured to receive at least one of a first voltage from the first power rail or a second voltage from the second power rail.

6. The semiconductor device of claim 1,
wherein the power tap cell comprises a first dummy region and a second dummy region separated from each other by an element separation film, and a dummy gate electrode on the first dummy region and the second dummy region, and
wherein the first power through via and the second power through via penetrate the element separation film.

7. The semiconductor device of claim 1, wherein at least a part of the first power through via overlaps the second power through via in the second direction.

8. A semiconductor device comprising:
a substrate comprising a first side and a second side that are opposite to each other;
a first power rail and a second power rail that are on the first side of the substrate, extend in a first direction, and are spaced apart from each other in a second direction;
a first dummy region and a second dummy region on the first side of the substrate, with an element separation film between the first power rail and the second power rail;
a power delivery network on the second side of the substrate;
a first power through via that penetrates the element separation film and the substrate, and connects the power delivery network and the first power rail; and
a second power through via that penetrates the element separation film and the substrate, and connects the power delivery network and the second power rail,
wherein the first power rail comprises a first extension part that extends in the first direction, and a first expansion part that has a first width greater than a second width of the first extension part in the second direction,
wherein the second power rail comprises a second extension part that extends in the first direction, and a second expansion part that has a third width greater than the second width of the first extension part in the second direction,
wherein the first power through via is connected to the first expansion part, and
wherein the second power through via is connected to the second expansion part.

9. The semiconductor device of claim 8, wherein a distance from the first extension part to the second extension part in the second direction is different from a distance from the first power through via to the second power through via in the second direction.

10. The semiconductor device of claim 9, wherein the distance from the first extension part to the second extension part in the second direction is greater than the distance from the first power through via to the second power through via in the second direction.

11. The semiconductor device of claim 8, wherein a distance from the first extension part to the second extension part in the second direction is equal to a distance from the first power through via to the second power through via in the second direction.

12. The semiconductor device of claim 8, wherein an upper surface of the first power through via in a third direction is inside the first expansion part, and wherein an upper surface of the second power through via in the third direction is inside the second expansion part.

13. The semiconductor device of claim 8, further comprising:

a first active pattern that extends in the second direction on the first dummy region; and a second active pattern that extends in the second direction on the second dummy region, wherein the first active pattern and the second active pattern are sequentially stacked in a direction from the second side of the substrate to the first side, and comprise a plurality of upper patterns spaced apart from each other.

14. The semiconductor device of claim 8, further comprising:

a first active pattern that extends in the second direction on the first dummy region; and a second active pattern that extends in the second direction on the second dummy region, wherein the first active pattern and the second active pattern comprise a fin type pattern that protrudes from the first side of the substrate.

15. A semiconductor device comprising:

a substrate comprising a plurality of power tap cells and a plurality of logic cells;

a first power rail and a second power rail that extend in a first direction and are arranged in a second direction, on a first side of the substrate, wherein:

the first power rail comprises a first extension part that extends in the first direction, and a first expansion part that has a first width greater than a second width of the first extension part in the second direction, and the second power rail comprises a second extension part that extends in the first direction, and a second expansion part that has a third width greater than the second width of the first extension part in the second direction; and a power delivery network on a second side opposite the first side of the substrate, wherein respective ones of the plurality of power tap cells comprises:

a first power through via that penetrates the first side of the substrate to connect the first power rail and the power delivery network, wherein the first power through via is connected to the first expansion part; and a second power through via that penetrates the first side of the substrate to connect the second power rail and the power delivery network, wherein the second power through via is connected to the second expansion part.

16. The semiconductor device of claim 15, wherein a distance from the first extension part to the second extension part in the second direction is equal to a distance from the first expansion part to the second expansion part in the second direction.

17. The semiconductor device of claim 15, wherein a distance from the first extension part to the second extension part in the second direction is greater than a distance from the first expansion part to the second expansion part in the second direction.

18. The semiconductor device of claim 15, wherein the plurality of logic cells comprise first and second logic cells having different cell heights from each other.

* * * * *